US010262902B2

(12) United States Patent
Sekigawa et al.

(10) Patent No.: US 10,262,902 B2
(45) Date of Patent: Apr. 16, 2019

(54) MULTIPLEXER AND INTEGRATED CIRCUIT USING THE SAME

(71) Applicant: National Institute of Advanced Industrial Science and Technology, Tokyo (JP)

(72) Inventors: Toshihiro Sekigawa, Tsukuba (JP); Masakazu Hioki, Tsukuba (JP); Hanpei Koike, Tsukuba (JP)

(73) Assignee: National Institute of Advanced Industrial Science and Technology, Tokyo (JP)

(*) Notice: Subject to any disclaimer, the term of this patent is extended or adjusted under 35 U.S.C. 154(b) by 0 days.

(21) Appl. No.: 15/761,628

(22) PCT Filed: Sep. 21, 2016

(86) PCT No.: PCT/JP2016/077764
§ 371 (c)(1),
(2) Date: Mar. 20, 2018

(87) PCT Pub. No.: WO2017/057112
PCT Pub. Date: Apr. 6, 2017

(65) Prior Publication Data
US 2018/0350690 A1 Dec. 6, 2018

(30) Foreign Application Priority Data
Oct. 2, 2015 (JP) .................. 2015-196520

(51) Int. Cl.
*H01L 21/8238* (2006.01)
*H01L 27/08* (2006.01)
(Continued)

(52) U.S. Cl.
CPC .......... *H01L 21/8238* (2013.01); *H01L 27/08* (2013.01); *H01L 27/092* (2013.01);
(Continued)

(58) Field of Classification Search
CPC ..................... H01L 21/8238; H01L 27/092
(Continued)

(56) References Cited

U.S. PATENT DOCUMENTS

| 4,074,302 | A | * | 2/1978 | Brewer | ............... G11C 19/282 |
| | | | | | 257/216 |
| 2008/0191788 | A1 | * | 8/2008 | Chen | ............... H01L 29/66772 |
| | | | | | 327/537 |
| 2010/0172195 | A1 | * | 7/2010 | Moore | ............... G11O 5/005 |
| | | | | | 365/189.16 |

FOREIGN PATENT DOCUMENTS

JP 2006-166384 A 6/2006
JP 2006-295653 A 10/2006
(Continued)

OTHER PUBLICATIONS

International Search Report for PCT Serial No. PCT/JP2016/077764 dated Dec. 13, 2016.
(Continued)

*Primary Examiner* — Jami Valentine Miller
(74) *Attorney, Agent, or Firm* — McCormick, Paulding & Huber LLP

(57) ABSTRACT

The multiplexer includes a plurality of transmission gates each formed by four-terminal double insulated gate N-type and P-type field effect transistors connected in parallel. One of gates of the N-type gate field effect transistor is connected to a first threshold voltage control node, and a first resistor is connected between the first threshold voltage control node and a first threshold voltage control voltage source. One of gates of the P-type gate field effect transistor is connected to a second threshold voltage control node, and a second resistor is connected between the second threshold voltage control node and a second threshold voltage control voltage source.

17 Claims, 14 Drawing Sheets

(51) Int. Cl.
*H01L 27/092* (2006.01)
*H03K 17/00* (2006.01)
*H03K 17/693* (2006.01)
*H03K 19/094* (2006.01)
*H03K 19/0944* (2006.01)

(52) U.S. Cl.
CPC ........... *H03K 17/00* (2013.01); *H03K 17/693* (2013.01); *H03K 19/094* (2013.01); *H03K 19/0944* (2013.01)

(58) Field of Classification Search
USPC ........................................................ 257/369
See application file for complete search history.

(56) References Cited

FOREIGN PATENT DOCUMENTS

| JP | 2008-28916 A | 2/2008 |
|---|---|---|
| JP | 2013-4998 A | 1/2013 |

OTHER PUBLICATIONS

R. Tsuchiya, M. Horiuchi, S. Kimura, M. Yamaoka, T. Kawahara, S. Maegawa, T. Ipposhi, Y. Ohji, and H. Matsuoka, "Silicon on Thin BOX: A New Paradigm of The CMOSFET for Low-Power and High-Performance Application Featuring Wide-Range Back-Bias Control", IEDM Tech. Dig., 2004, pp. 475-47.

* cited by examiner (a) INPUT SIGNAL (b) POTENTIAL OF GN2CN (a) INPUT SIGNAL (b) POTENTIAL OF GN2CN (a)

(b)

(c)

(a)

(b)

(c)

(a)                (b)

(a)　　　　　　　　　(b)

(a)    (b)

MULTIPLEXER AND INTEGRATED CIRCUIT USING THE SAME

CROSS-REFERENCE TO RELATED APPLICATIONS

This application is a National Stage application of International Patent Application No. PCT/JP2016/077764, filed on Sep. 21, 2016, which claims priority to Japanese Patent Application Number 2015-196520, filed on Oct. 2, 2015, each of which is hereby incorporated by reference in its entirety.

TECHNICAL FIELD

The present invention relates to a multiplexer using a four-terminal double insulated gate field effect transistor and an integrated circuit using the multiplexer, and more particularly to a multiplexer capable of achieving both reduction in leakage current and increase in transfer rate and an integrated circuit using the multiplexer.

BACKGROUND ART

For example, Japanese Patent Application Laid-Open Publication No. 2008-28916 discloses a four-terminal double insulated gate field effect transistor (FTMOST) having two insulated gates (first gate and second gate) provided so as to face each other across a channel and electrically insulated from each other. R. Tsuchiya, M. Horiuchi, S. Kimura, M. Yamaoka, T. Kawahara, S. Maegawa, T. Ipposhi, Y. Ohji, and H. Matsuoka, "Silicon on Thin Box: A New Paradigm of The CMOSFET for Low-Power and High-Performance Application Featuring Wide-Range Back-Bias Control"," IEDM Tech. Dig., 2004, pp. 475-478 discloses a MOS transistor referred to as an SOTB (Silicon On Thin Buried Oxide) MOS transistor (SOTBMOST) that is formed on a semiconductor layer on a thin buried oxide film provided on a semiconductor substrate, that is, an SOI (Silicon On Insulator), wherein a front surface gate is used as a first gate and a back gate in a semiconductor region under the thin buried oxide film electrically insulated from the first gate is used as a second gate.

Note that the SOTBMOST may be structurally regarded as the FTMOST, and a threshold voltage viewed from the first gate can be controlled by the potential applied to the second gate. Therefore, hereinafter, the MOS transistor including SOTBMOST will be referred to as a four-terminal double insulated gate field effect transistor (FTMOST) unless otherwise specified.

Meanwhile, there is a multiplexer using the above-described MOS transistor as a pass transistor. In such a multiplexer, a control signal is already applied at the time when an input logic signal is applied. Namely, which input node has been selected is determined in advance. Therefore, there is a demand for reduction of a propagation delay time taken from the application of the input logic signal to the selected input node to the output of the signal to an output node QM via a selected signal path or a demand for increase in the transfer rate (indicated by frequency) represented by the reciprocal of the propagation delay time.

Here, the propagation delay time is determined by the capacitance between the drain or source of each pass transistor constituting the signal path and the ground (GND). In other words, the smaller the capacitance, the shorter the propagation delay time can be. The capacitance, however, is substantially determined by transistor dimensions, and thus is difficult to control.

Japanese Patent Application Laid-Open Publication No. 2008-28916 describes a method of reducing the propagation delay time by a circuit configuration with respect to the pass transistor formed by the FTMOST. Specifically, one end of a resistor R is connected to the second gate, and the other end of the resistor is connected to a threshold voltage control node VTCN of the FTMOST (see FIG. 27). Alternatively, in a case where two pass transistors PFT1 and PFT2 are connected in series, the second gates of the pass transistors are commonly connected and are further connected to one end of the resistor R, and the other end of the resistor is connected to the threshold voltage control node VTCN of the two FTMOSTs (see FIG. 28). However, none of these is application for a pass transistor in a multiplexer. Moreover, although these state that the propagation delay time can be reduced by the control signal applied to each of the gates, such operation is not possible in the multiplexer because the constant potential is already applied to the gate in the multiplexer.

Note that Japanese Patent Application Laid-Open Publication No. 2006-166384 describes that a resistor is connected between a second gate of the FTMOST and a voltage source for controlling the threshold voltage such that an operation speed of a circuit is improved by an input signal applied to a first gate in a gate circuit or a memory circuit using FTMOST.

SUMMARY

Since a typical multiplexer uses a large number of pass transistors, the number of resistors needed would be the same as the number of pass transistors simply in the method described above. This leads to a problem of an increase in the number of circuit elements and a resulting increase in the element area and the number of wires in a case of forming a multiplexer using an integrated circuit.

Moreover, the multiplexer does not have the configuration in which pass transistors are simply connected in series, but on-state pass transistors are connected from one selected input to the output. However, the pass transistor to be connected is not determined in advance as a circuit and is changed depending on the selected input.

Accordingly, in a multiplexer, there is a demand for reduction of the propagation delay time from the input to the output regardless of the selected input. Note that drain-source resistance ($R_{on}$) of the on-state pass transistor is low resistance, and this would allow a current to easily flow between the drain and the source when there is a potential difference between the drain and the source. Conversely, drain-source resistance ($R_{off}$) in an off-state pass transistor is high resistance, and this would not allow a current to easily flow (or allow an extremely small current to flow, if any) even when there is a potential difference between the drain and the source. This is referred to as a "leakage current" and the leakage current can be reduced by increasing an absolute value of a threshold voltage of the pass transistor by the potential of the common second gate. However, this leads to an increase of $R_{on}$, resulting in the decrease in the transfer rate.

The present invention has been made in view of the above situation, and an object thereof is to provide a multiplexer using an FTMOST and capable of achieving both increase in transfer rate and reduction in leakage current.

The multiplexer according to the present invention is a multiplexer comprising a plurality of pass transistors each formed by a four-terminal double insulated gate field effect transistor, wherein one of gates of the field effect transistor is connected to a threshold voltage control node, and a resistor is connected between the threshold voltage control node and a threshold voltage control voltage source.

In the invention described above, the field effect transistor is of N-type, and the resistor is a nonlinear resistor having two high and low resistance values and is configured to take the high resistance value when a potential of the threshold voltage control node is above a reference potential based on a potential of the threshold voltage control power supply.

Also, in the invention described above, the field effect transistor is of P-type, and the resistor is a nonlinear resistor having two high and low resistance values and is configured to take the low resistance value when a potential of the threshold voltage control node is above a reference potential based on a potential of the threshold voltage control power supply.

Also, in the invention described above, the nonlinear resistor is a four-terminal double insulated gate N-type field effect transistor, one of gates is connected to a power supply connection node to which the threshold voltage control voltage source is connected, and a source and a drain or a drain and a source are connected to the power supply connection node and the threshold voltage control node, respectively.

Also, in the invention described above, the nonlinear resistor is a four-terminal double insulated gate P-type field effect transistor, one of gates is connected to a power supply connection node to which the threshold voltage control voltage source is connected, and a source and a drain or a drain and a source are connected to the power supply connection node and the threshold voltage control node, respectively.

Further, the multiplexer according to the present invention is a multiplexer comprising a plurality of transmission gates each formed by four-terminal double insulated gate N-type and P-type field effect transistors connected in parallel, wherein one of gates of the N-type gate field effect transistor is connected to a first threshold voltage control node, a first resistor is connected between the first threshold voltage control node and a first threshold voltage control voltage source, one of gates of the P-type gate field effect transistor is connected to a second threshold voltage control node, and a second resistor is connected between the second threshold voltage control node and a second threshold voltage control voltage source.

In the invention described above, each of the first and second resistors is a nonlinear resistor having two high and low resistance values, the first resistor is configured to take the high resistance value when a potential of the first threshold voltage control node is above a reference potential based on a potential of the first threshold voltage control voltage source, and the second resistor is configured to be from the high resistance value to the low resistance value when a potential of the second threshold voltage control node exceeds a reference potential based on a potential of the second threshold voltage control voltage source.

In the invention described above, the first resistor and the second resistor are four-terminal double insulated gate N-type and P-type field effect transistors, respectively, the first resistor is configured such that one of gates is connected to a power supply connection node to which the first threshold voltage control voltage source is connected and a source and a drain or a drain and a source are connected to the power supply connection node and the first threshold voltage control node, respectively, and the second resistor is configured such that one of gates is connected to a power supply connection node to which the second threshold voltage control voltage source is connected, and configured to be connected to the power supply connection node and the second threshold voltage control node.

Furthermore, an integrated circuit according to the present invention is characterized by including the above-described multiplexer.

BRIEF DESCRIPTIONS OF THE DRAWINGS

Figure 6:
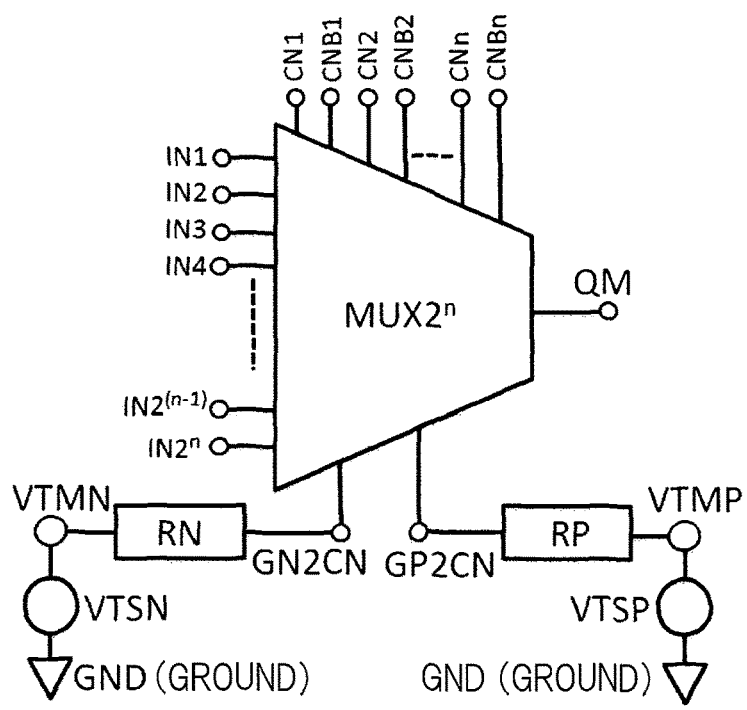

FIG. 6 is a diagram showing a multiplexer using a transmission gate according to a third embodiment. One end of a resistor RN is connected to a threshold voltage control node of an N-type pass transistor, and the other end of the RN is connected to a power supply connection node to which a threshold voltage control power supply of the N-type pass transistor is connected. Moreover, one end of a resistor RP is connected to a threshold voltage control node of a P-type pass transistor, and the other end of the RP is connected to a power supply connection node to which a threshold voltage control power supply of the P-type pass transistor is connected.

Figure 7:
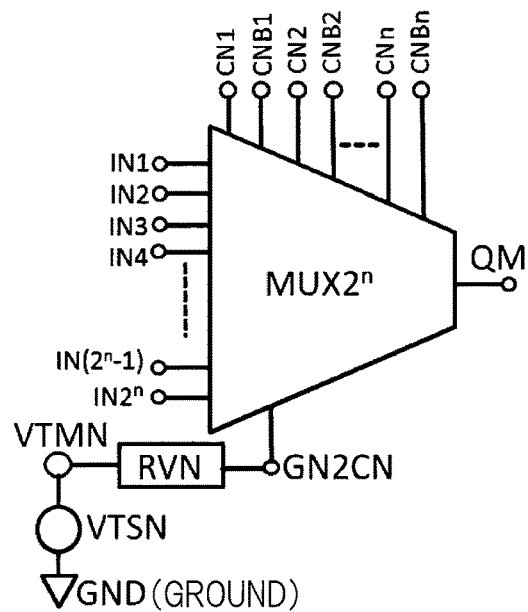

FIG. 7 is a diagram showing a multiplexer using an N-type pass transistor according to a fourth embodiment. One end of a nonlinear resistor RVN is connected to a threshold voltage control node, and the other end of the RVN is connected to a power supply connection node to which a threshold voltage control power supply is connected.

Figure 8:
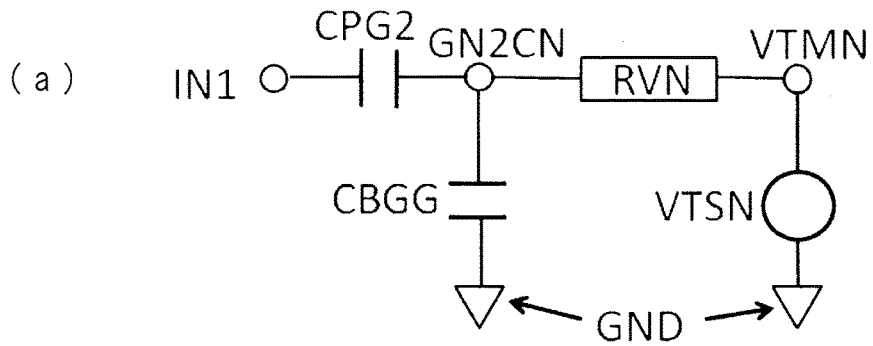
Figure 8:
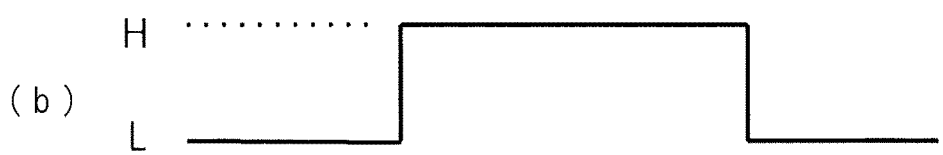
Figure 8:
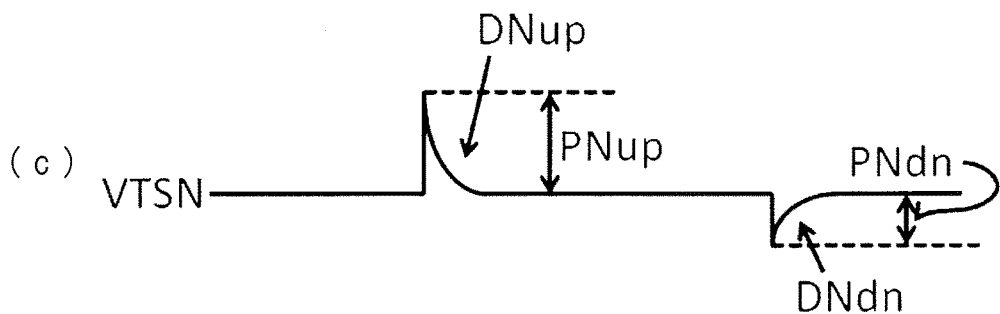

FIG. 8 is an explanatory diagram for an operation principle of the fourth embodiment.

Figure 9:
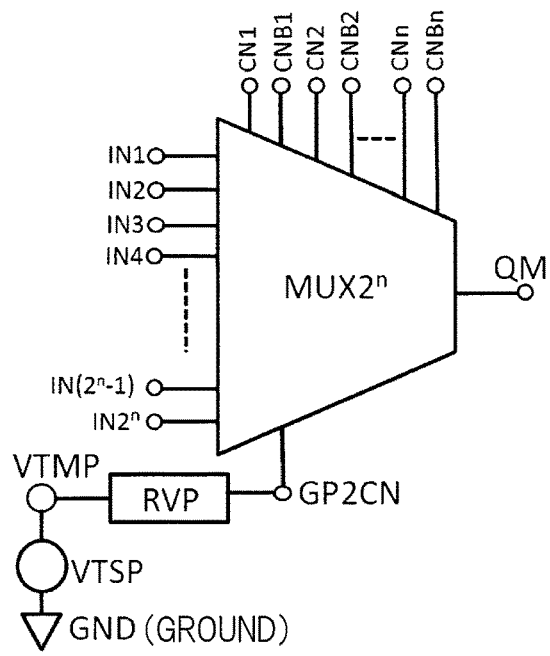

FIG. 9 is a diagram showing a multiplexer using a P-type pass transistor according to a fifth embodiment. One end of a nonlinear resistor RVP is connected to a threshold voltage control node, and the other end of the RVP is connected to a power supply connection node to which a threshold voltage control power supply is connected.

Figure 10:
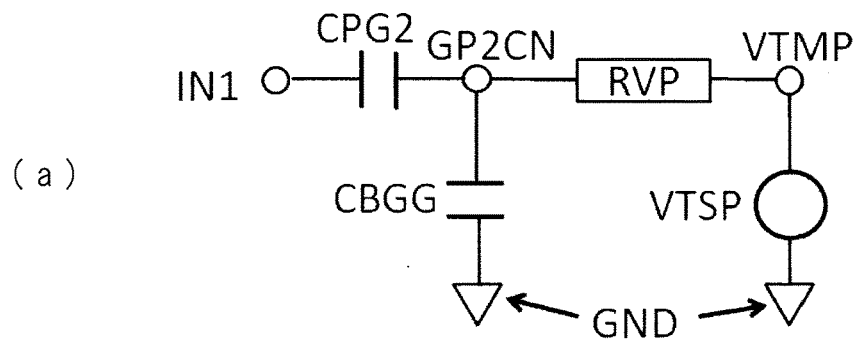
Figure 10:
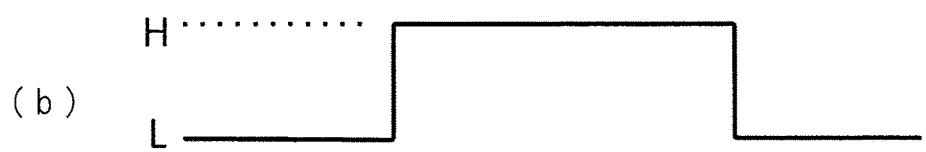
Figure 10:
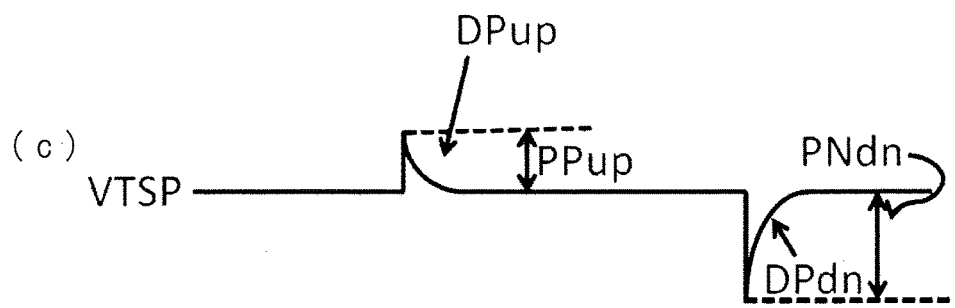

FIG. 10 is an explanatory diagram for an operation principle of the fifth embodiment.

Figure 11:
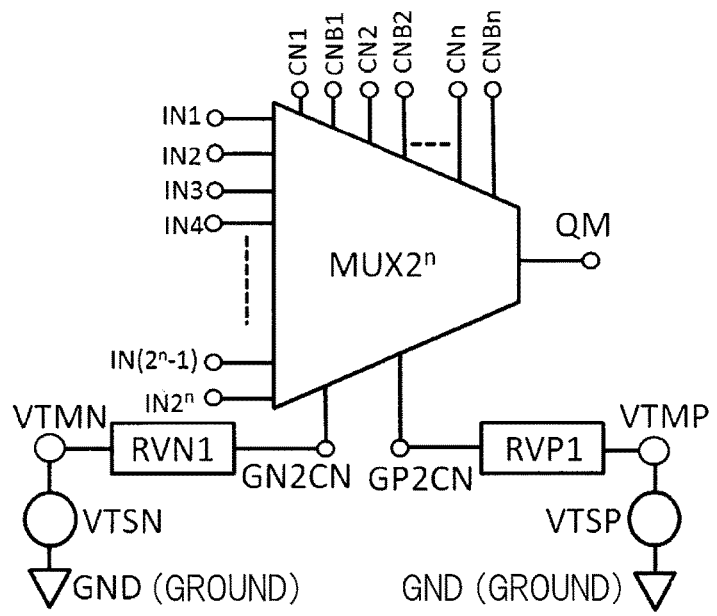

FIG. 11 is a diagram showing a multiplexer using a transmission gate according to a sixth embodiment. One end of a nonlinear resistor RVN1 is connected to a threshold voltage control node of an N-type pass transistor, and the other end of the RVN1 is connected to a power supply connection node to which a threshold voltage control power supply of the N-type pass transistor is connected. Moreover, one end of a nonlinear resistor RVP1 is connected to a threshold voltage control node of a P-type pass transistor, and the other end of the RVP1 is connected to a power supply connection node to which a threshold voltage control power supply of the P-type pass transistor is connected.

Figure 12:
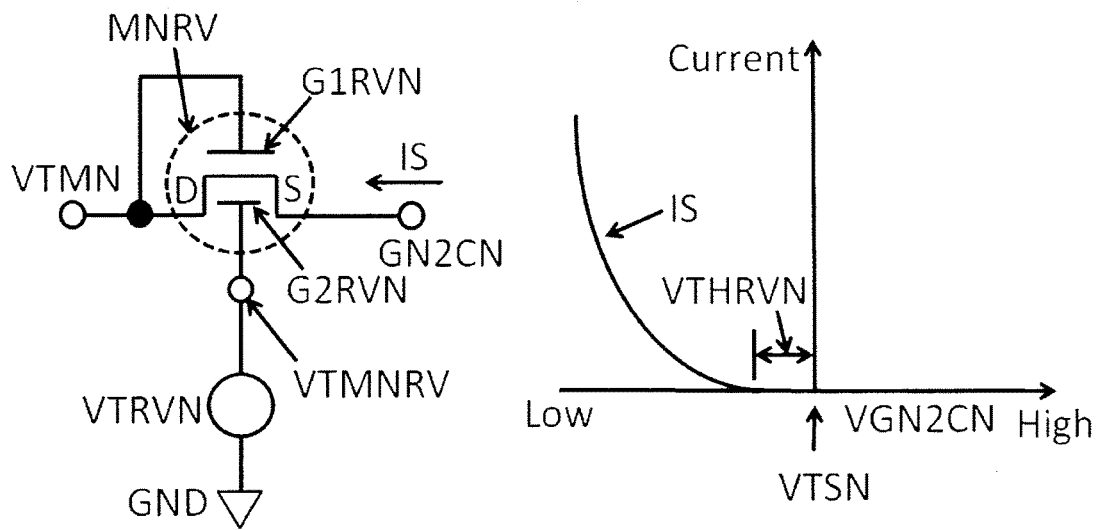

FIG. 12 is a diagram showing the nonlinear resistor RVN (or RVN1).

Figure 13:
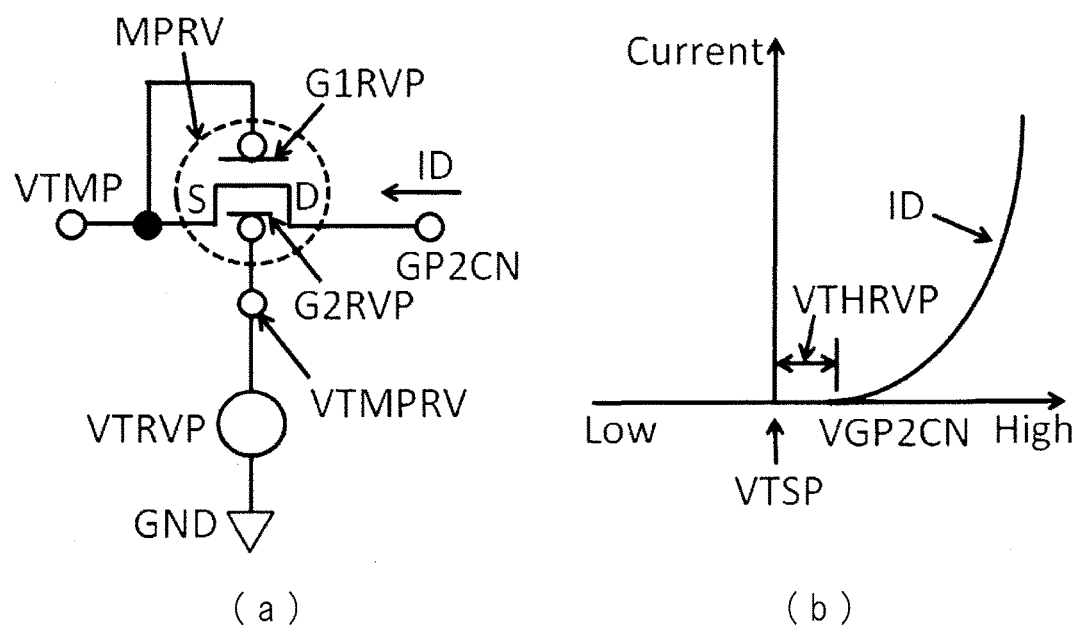

FIG. 13 is a diagram showing the nonlinear resistor RVP (or RVP1).

Figure 14:
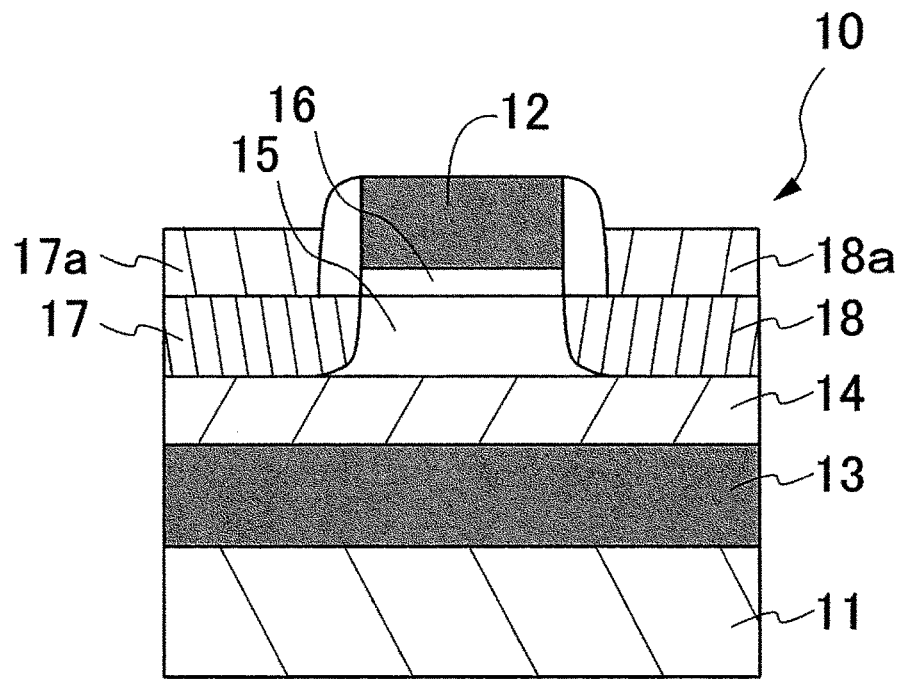

FIG. 14 is a cross-sectional view showing a structure of a SOTBMOS transistor.

Figure 15:
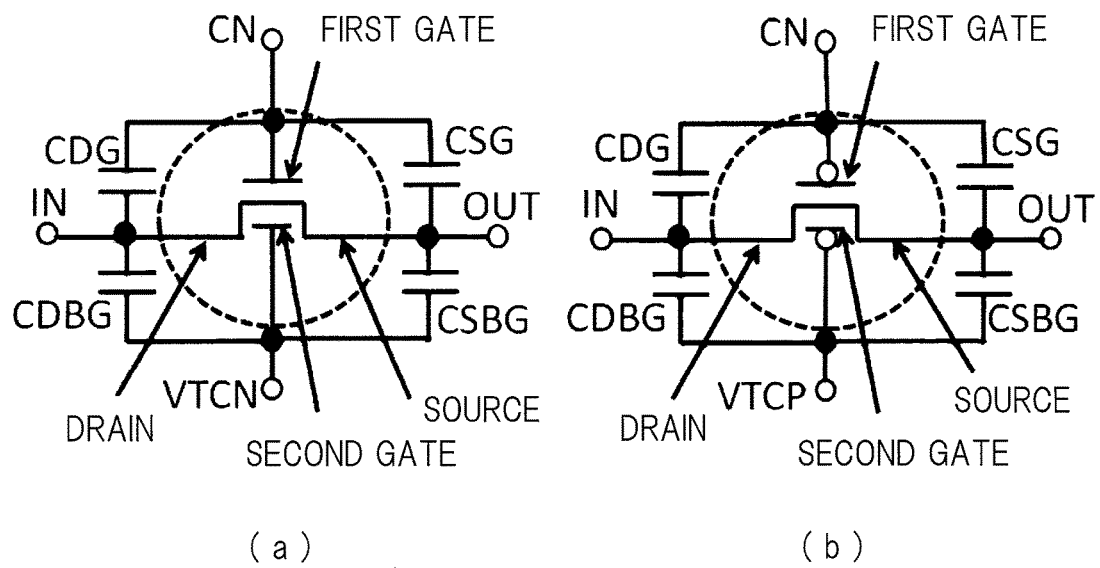

FIG. 15 is an explanatory diagram for a circuit configuration of a conventional pass transistor using an N-type FTMOS transistor (a) and a circuit configuration of a conventional pass transistor using a P-type FTMOS transistor (b), and circuit symbols and parasitic capacitances of the respective transistors.

Figure 16:
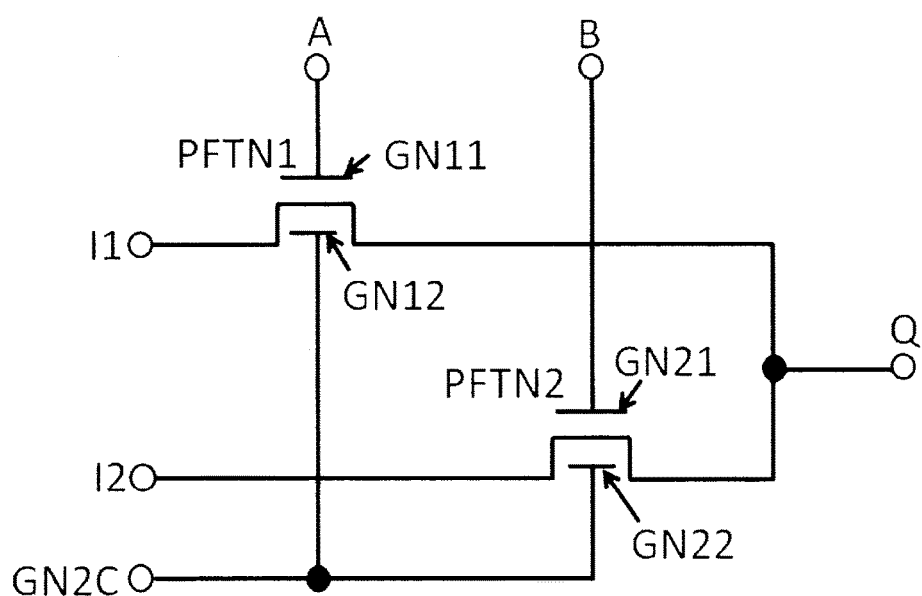

FIG. 16 is a diagram showing a circuit configuration of a conventional selector using the N-type FTMOS transistor as a pass transistor.

Figure 17:
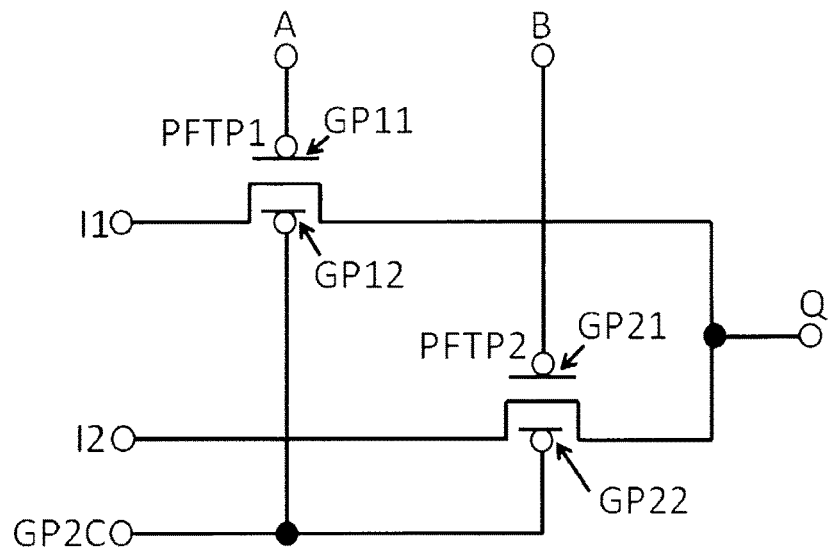

FIG. 17 is a diagram showing a circuit configuration of a conventional selector using the P-type FTMOS transistor as a pass transistor.

Figure 18:
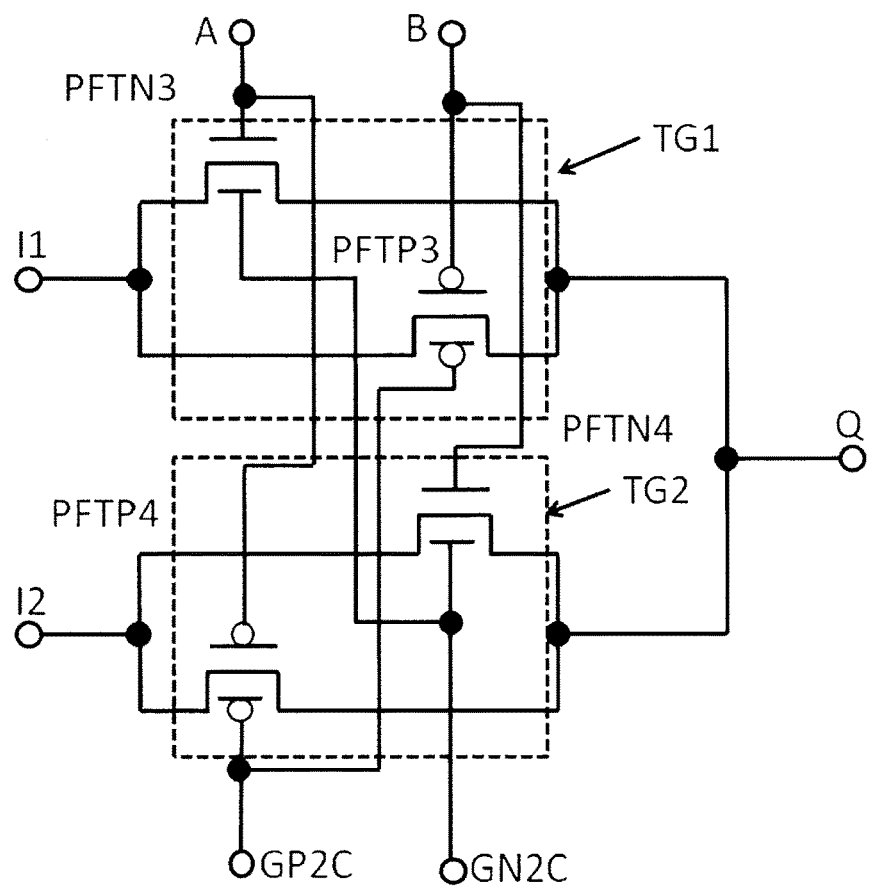

FIG. 18 is a diagram showing a circuit configuration of a conventional selector using a transmission gate formed by N-type and P-type FTMOS transistors.

Figure 19:
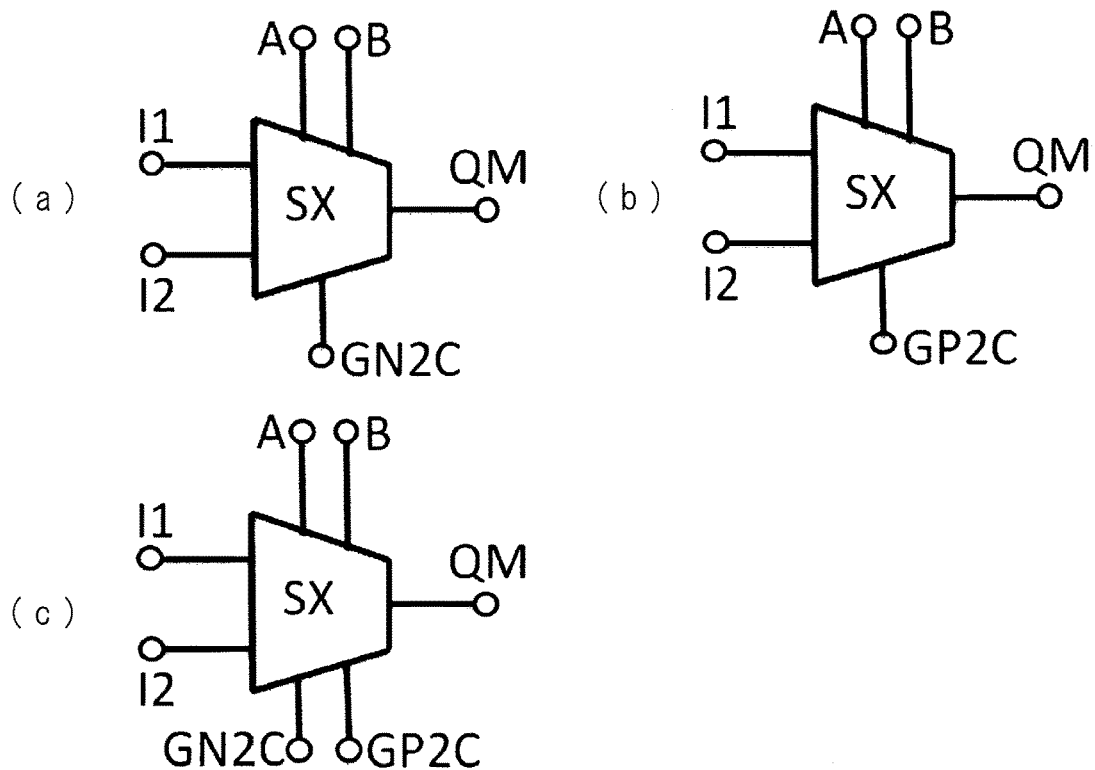

FIG. 19 is a diagram showing circuit symbols of the selectors corresponding to FIGS. 16 to 18.

Figure 20:
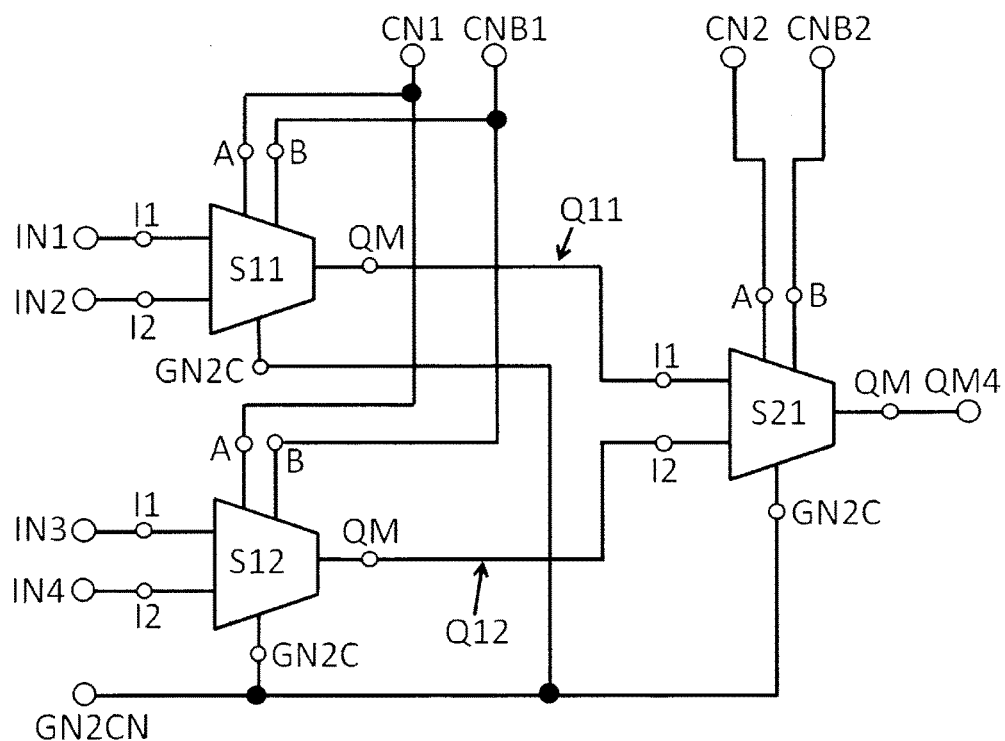

FIG. 20 is a diagram showing a conventional 4-input 1-output multiplexer using a selector formed by an N-type pass transistor.

Figure 21:
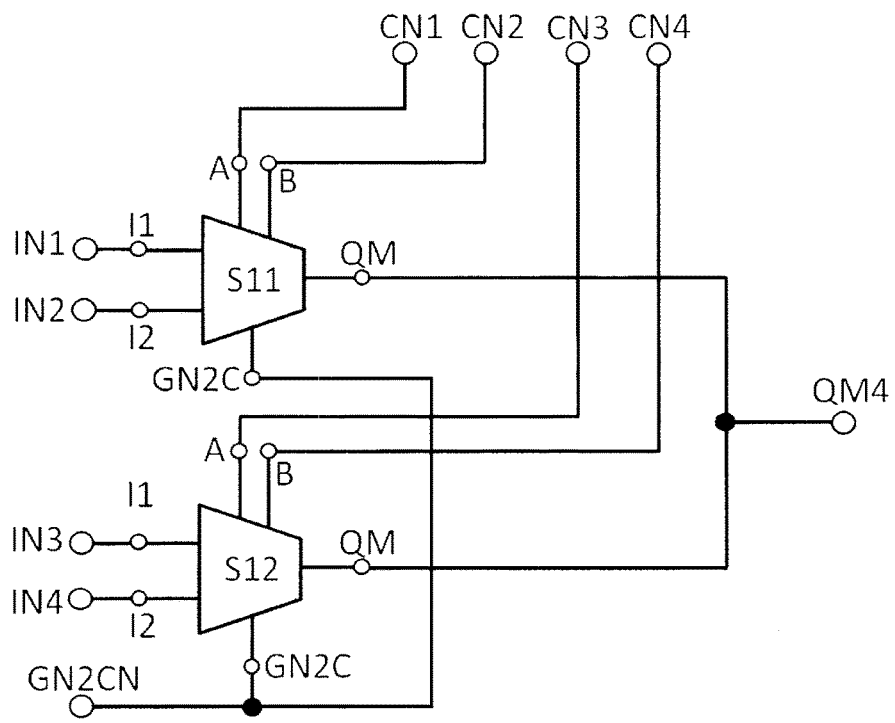

FIG. 21 is a diagram showing a conventional 4-input 1-output multiplexer in which the number of selectors is reduced with respect to the multiplexer shown in FIG. 20.

Figure 22:
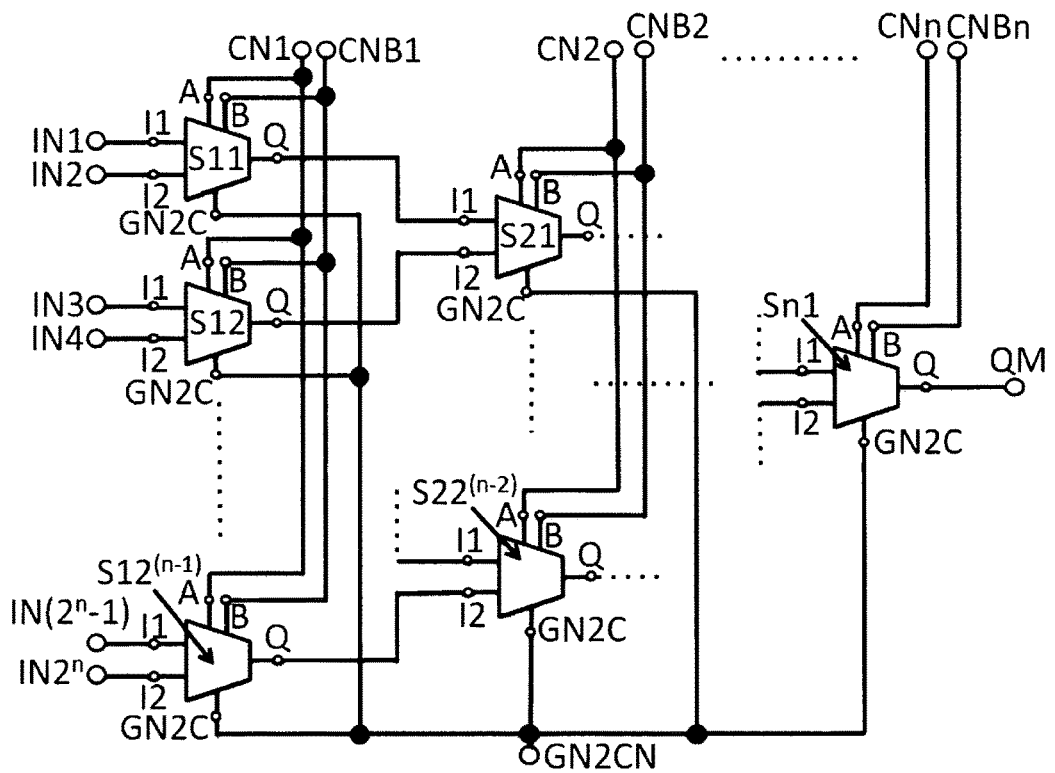

FIG. 22 is a diagram showing a conventional $2^n$-input 1-output multiplexer using a selector formed by an N-type pass transistor.

Figure 23:
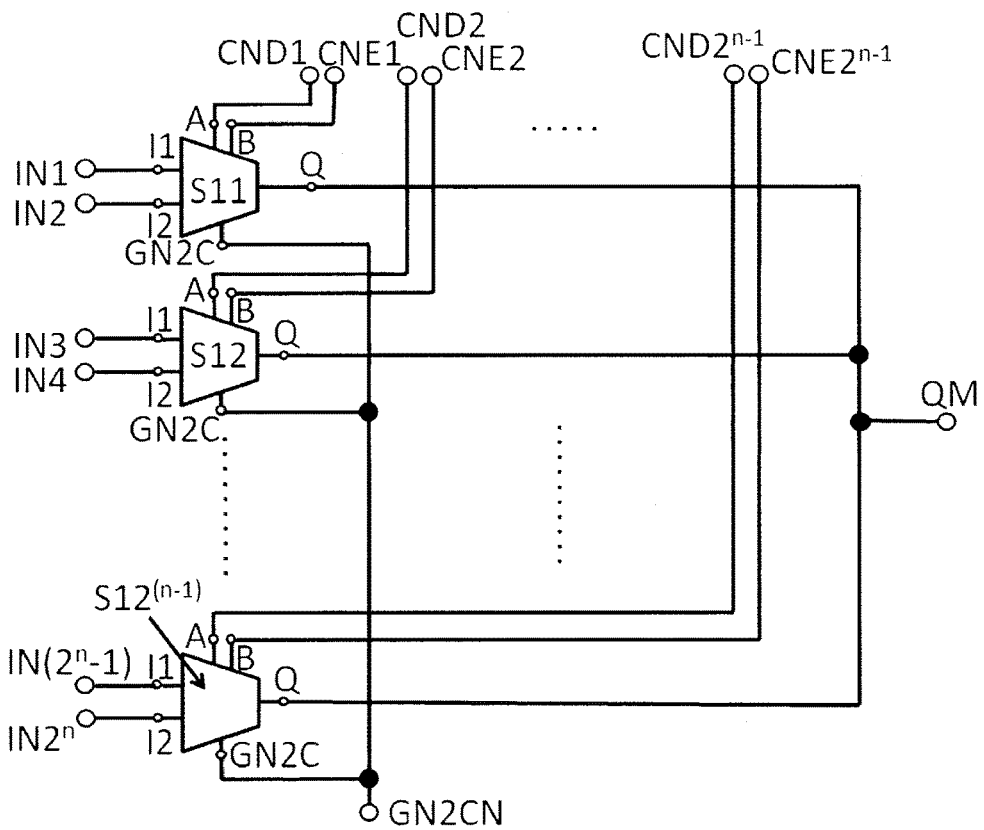

FIG. 23 is a diagram showing a multiplexer in which the number of selectors is reduced with respect to the multiplexer shown in FIG. 22.

Figure 24:
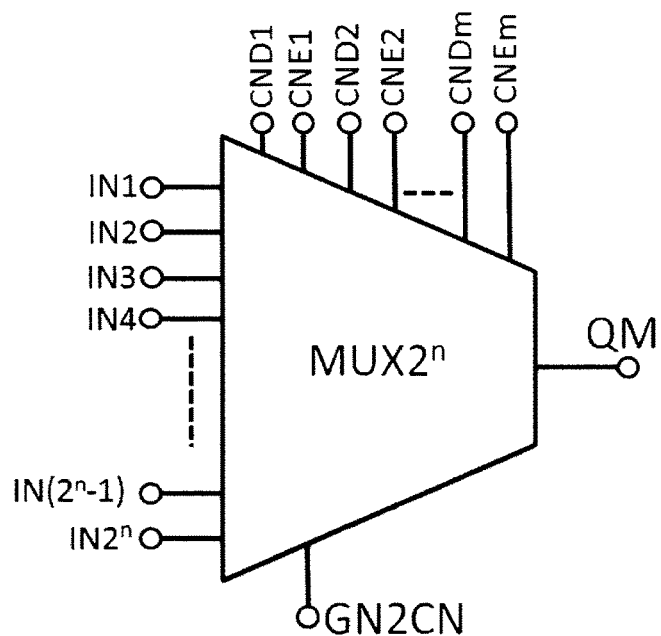

FIG. 24 is a diagram showing a $2^n$-input 1-output multiplexer using an N-type pass transistor.

Figure 25:
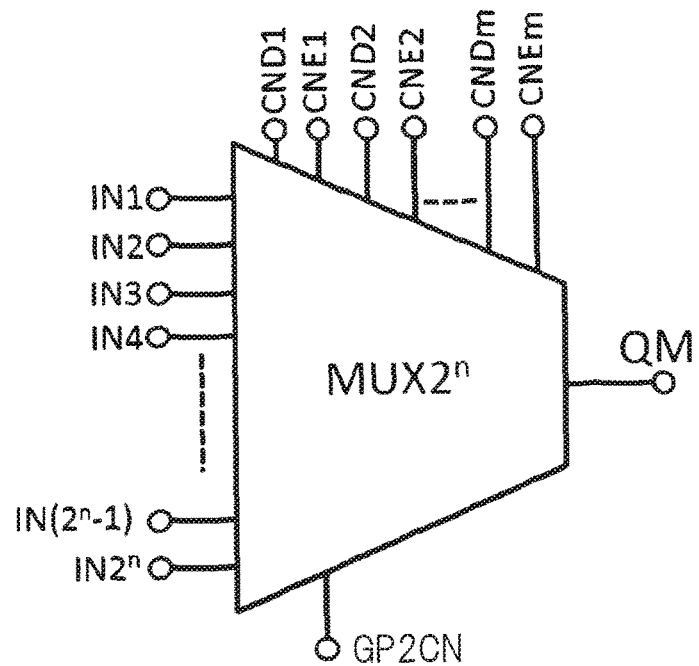

FIG. 25 is a diagram showing a $2^n$-input 1-output multiplexer using a P-type pass transistor.

Figure 26:
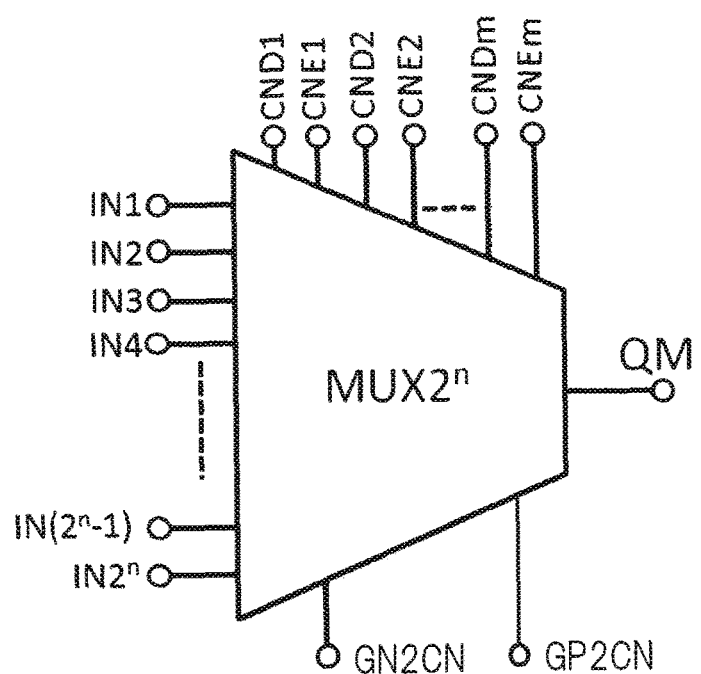

FIG. 26 is a diagram showing a $2^n$-input 1-output multiplexer using a transmission gate.

Figure 27:
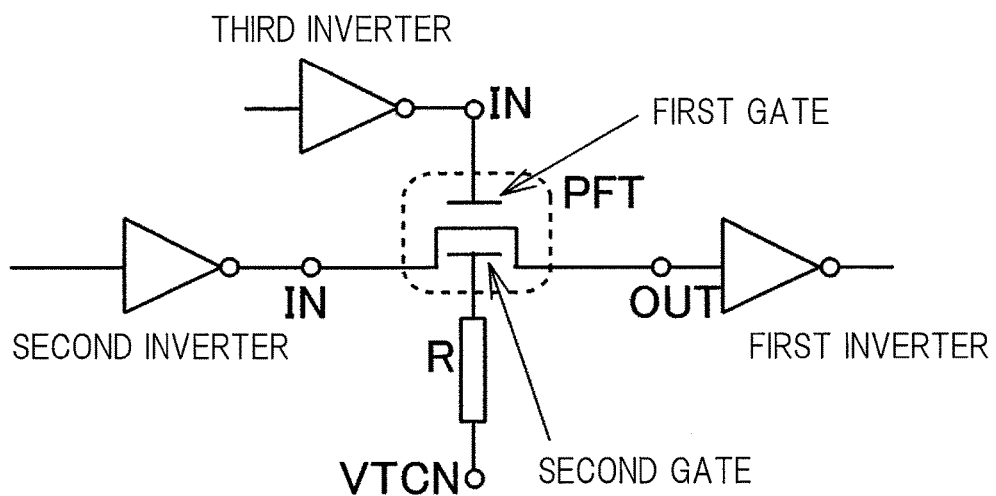

FIG. 27 is a connection diagram of a pass transistor using an FTMOS transistor. Here, a resistor R is provided between a second gate and its threshold voltage control power supply, so that improvement in an operation speed can be achieved by pulses of the first gate.

Figure 28:
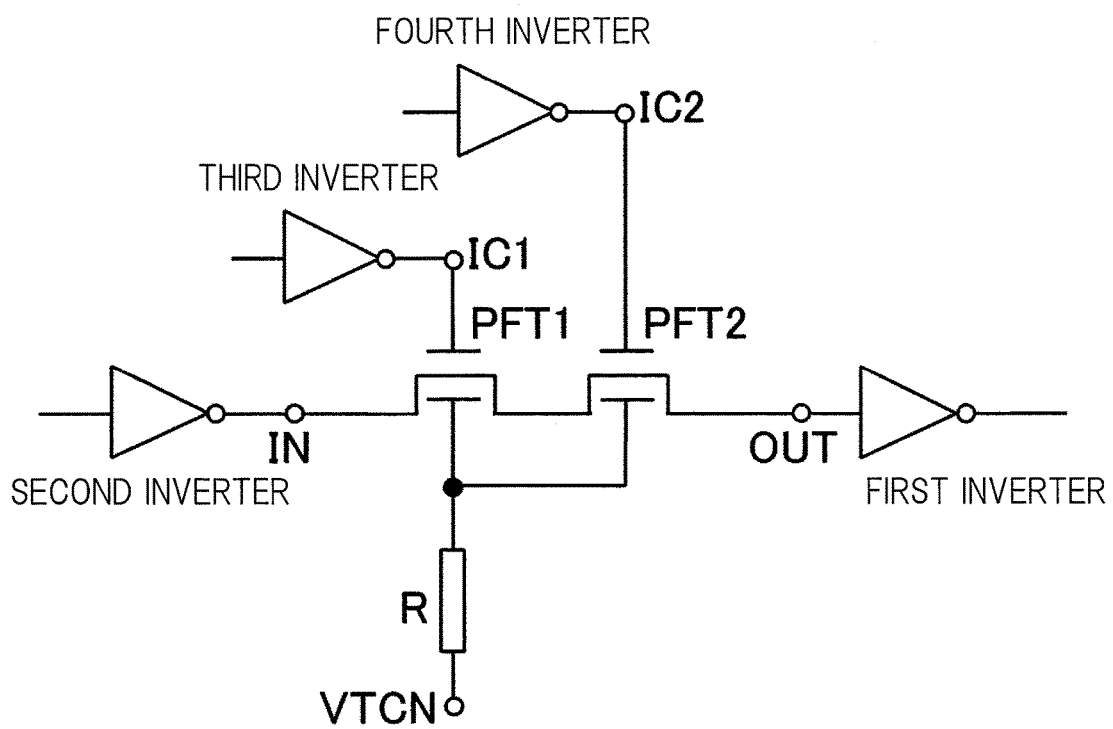

FIG. 28 is a connection diagram in which two pass transistors using FTMOS transistors are connected in series. Here, respective second gates are commonly connected and a resistor R is provided between the second gates and a threshold voltage control power supply, so that improvement in an operation speed can be achieved by pulses of the first gates of both pass transistors.

DETAILED DESCRIPTION

First, FIG. 14 shows a cross-sectional structure of a four-terminal double insulated gate field effect transistor (FTMOST) 10 having an SOTB (Silicon On Thin Buried Oxide) structure. On a substrate 11, a first gate 12 and a second gate (back gate) 13 which are two insulated gates electrically insulated from each other are provided to face each other with an oxide film 14, a channel 15 and a gate insulating film 16 interposed therebetween. On both sides of the channel 15, a source 17 and a drain 18 are provided, and a source electrode 17a and a drain electrode 18a are disposed on the source 17 and the drain 18, respectively.

Next, a multiplexer will be described. In this case, a nodal point to be referenced with a given name to be distinguished from others among nodal points in the wiring of the electronic circuit will be referred to as a node and is indicated by an open circle in the circuit diagram. A point simply indicating a nodal point of wiring will be indicated by a filled circle. Moreover, in a case where an electronic circuit is used as a logic circuit, an electric signal such as a voltage and a current corresponding to a logical value will be referred to as a logic signal.

A multiplexer is a type of electronic circuit handling a voltage pulse signal, and includes a plurality of input nodes, a plurality of (one in usual cases) output nodes and a plurality of control nodes. The multiplexer selects one of electric signals applied to the input nodes in accordance with a combination of electric signals applied to the control nodes, and outputs an electric signal logically equivalent to or inverted from the selected signal to the output nodes. The number of control nodes depends on the number of input nodes and a specific electronic circuit configuration.

FIGS. 15(a) and 15(b) show basic logic circuits respectively using N-type and P-type FTMOSTs as pass transistors. The portion surrounded by the broken line indicates an electronic circuit symbol of the FTMOST. In this logic circuit, a drain is connected to an input node IN of the logic signal, a source is connected to an output node OUT of the logic signal, and a first gate thereof is connected to a control signal input node CN. An on-state and an off-state are controlled by an electric signal applied to the CN. In the on-state, the pass transistor is conductive, namely, a source-drain resistance is small, and a logic signal equivalent to the logic signal applied to the input node appears at the output node. In the off-state, the pass transistor is nonconductive, namely, a source-drain resistance is large, and the logic signal applied to the input node does not appear substantially at the output node. A second gate thereof is connected to a threshold voltage control node of the pass transistor (VTCN in the case of N-type FTMOST, VTCP in the case of P-type FTMOST).

A voltage source having a constant voltage in a steady state is connected to the VTCN or VTCP in order to determine the threshold voltage of the pass transistor. CDBG and CSBG indicate parasitic capacitances between the drain and the second gate and between the source and the second gate, respectively. Moreover, CDG and CSG indicate parasitic capacitances between the drain and the first gate and between the source and the first gate, respectively. The capacitances of different pass transistors will be indicated by adding numbers at the end of the corresponding characters for distinction. Note that drain and source are interchangeable in this circuit.

FIGS. 16 and 17 each show a logic circuit of a selector using a pass transistor. The circuit uses, for example, two pass transistors of the N-type FTMOST shown in FIG. 15(a) (hereinafter referred to as N-type pass transistors), namely, PFTN1 and PFTN2. Alternatively, the circuit uses, for example, two pass transistors of the P-type FTMOST shown in FIG. 15(b) (hereinafter referred to as P-type pass transistors), namely, PFTP1 and PFTP2. The parasitic capacitance of each of the transistors shown in FIG. 15 is not illustrated for the sake of convenience, but constantly exists.

In FIG. 16, an input node of the PFTN1 is defined as an input node I1 of the selector, an input node of the PFTN2 is defined as an input node I2 of the selector, and respective output nodes (not shown) are commonly connected to be defined as an output node Q of the selector. Furthermore, a control gate of the PFTN1 is newly defined as a control signal input node A of the selector, and a control gate of the PFTN2 is newly defined as a control signal input node B of the selector. A first gate GN11 of the FTMOST constituting the PFTN1 is connected to the node A, and whether the PFTN1 is conductive or nonconductive is controlled by a control signal applied to the node A. Similarly, a first gate GN21 of the FTMOST constituting the PFTN2 is connected to the node B, and whether the PFTN2 is conductive or nonconductive is controlled by a control signal applied to the node B. The control signal input nodes A and B are collectively referred to as control nodes of the selector. Also, second gates GN12 and GN22 of the FTMOSTs constituting the PFTN1 and PFTN2 are commonly connected and are further connected to a threshold voltage control node GN2C of the selector.

Similarly, FIG. 17 shows a circuit using P-type pass transistors PFTP1 and PFTP2. The circuit configuration is the same as that in FIG. 16(a). However, first gates of the FTMOSTs constituting the PFTP1 and PFTP2 are denoted as GP11 and GP21, respectively, and second gates thereof are denoted as GP12 and GP22, respectively. The second gates are commonly connected and are further connected to a threshold voltage control node GP2C of the selector. Hereinafter, functions of the selector as a logic circuit will be described.

Control signals whose phases are mutually reversed, that is, whose logical values are mutually inverted when considered as logic signals (it is assumed to allow a time difference that would not affect a logic function when used as a logic circuit) are applied to the control signal input nodes A and B, and a logic signal equivalent to one of the logic signals applied to the input nodes I1 and I2 is output to an output node Q in accordance with the combination of the control signals. In this logic circuit function, the former case is abbreviated as "input node I1 is selected", and the latter case is abbreviated as "input node I2 is selected". Logic signals are sometimes used also for the control signals of the selector described above. Hereinafter, the character of the node will be used also for the logical value and voltage value of the logic signal applied to the node.

As shown in FIG. 18, the above-described selector may be configured of a transmission gate TG1 in which an N-type pass transistor PFTN3 and a P-type pass transistor PFTP3 are connected in parallel, that is, an input node and an output node thereof are mutually connected and a transmission gate TG2 in which an N-type pass transistor PFTN4 and a P-type pass transistor PFTP4 are connected in parallel. In this case, input nodes (not shown) of the PFTN3 and the PFTP3 are connected to the input node I1 of the selector, and input nodes (not shown) of the PFTN4 and the PFTP4 are connected to the input node I2 of the selector. Moreover, a control node of the PFTN3 and a control node (not shown) of the PFTP4 are connected to the control signal input node A of the selector, and a control node of the PFTN4 and a control node (not shown) of the PFTP3 are connected to the control signal input node B of the selector.

Furthermore, an output node (not shown) of each of the pass transistors is connected to the output node Q of the selector. Moreover, since potentials of the threshold voltage control nodes of the N-type and P-type pass transistors are given by mutually different threshold voltage control voltage sources, the threshold voltage control nodes (not shown) of the PFTN3 and the PFTN4 are connected to the first threshold voltage control node GN2C of the selector, and the threshold voltage control nodes (not shown) of the PFTP3 and the PFTP4 are connected to the second threshold voltage control node GP2C of the selector. The selector can be regarded as a 2-input multiplexer (MUX2).

Moreover, it is possible to expand functions by combining control signals. Specifically, by applying signals to allow the pass transistor to be conductive to the control signal nodes A and B, two inputs I1 and I2 can be selected. Conversely, by applying signals to allow the pass transistor to be nonconductive to the control signal nodes A and B, the inputs I1 and I2 can be made unselected. Logic signals may be used as control signals.

FIG. 19 shows circuit symbols in a case where the selector (or MUX2) of FIGS. 16 to 18 is used in an electronic circuit or a logic circuit. "SX" shown in the trapezoid of each of the symbols distinguishes the selector used in the circuit. X represents a character string of a certain length. Herein, the input node I1 is selected when the control signal A has a logical value of 1, and the input node I1 is unselected when the control signal A has a logical value of 0 in each of the selectors. Moreover, the input node I2 is selected when the control signal B has a logical value of 1, and the input node I2 is unselected when the control signal B has a logical value of 0.

FIG. 20 shows a configuration example of a 4-input 1-output multiplexer (MUX4) using the selectors represented by the circuit symbol of FIG. 19(a). This configuration includes a selector S11 to select any of the inputs IN1 and IN2 of the 4-input multiplexer, a selector S12 to select any of the inputs IN3 and IN4, and a selector S21 to select any of outputs Q11 and Q12, and the output of the S21 is connected to an output QM4 of the MUX4. A control signal CN1 and its inverted control signal CNB1 are respectively applied to the control signal nodes A and B of the selectors S11 and S12, and a control signal CN2 and its inverted control signal CNB2 are respectively applied to the control signal nodes A and B of the selector S21. The threshold voltage control node GN2C of each of the selectors is connected to a threshold voltage control node GN2CN of the MUX4.

The case where the multiplexer has one output has been described above, but the multiplexer is not limited to 1-output multiplexer and may include two or more output nodes. For example, the multiplexer configured of the S11 and the S12 and having the Q11 and the Q12 regarded as their outputs in FIG. 20 is provided as a 4-input 2-output multiplexer. Accordingly, a multiplexer with one output will be hereinafter described simply as a multiplexer, and a multiplexer with a plurality of outputs will be described as a 4-input 2-output multiplexer or the like.

FIG. 21 shows an example having less number of selectors than the example of FIG. 20 having three selectors. The outputs of the selectors S11 and S12 are connected to the output node QM4 of the MUX4, and the input nodes of the selectors are respectively connected to the input nodes IN1, IN2, IN3, and IN4 of the MUX4. In this case, the control signals CN1, CN2, CN3, and CN4 applied to the control signal nodes of the selectors need to be logically independently controlled signals. For example, in a case where IN1 is to be selected, CN1 needs to have a logical value of 1, and all of CN2, CN3, and CN4 need to have a logical value of 0 in order to make IN2, IN3, and IN4 unselected.

FIG. 22 shows a partial circuit of a $2^n$-input multiplexer obtained by generalizing the configuration of FIG. 20 with the use of the circuit symbol of FIG. 19(a). Note that n is an integer. The configuration of FIG. 22 is sufficient for a fundamental function of the multiplexer, but there may be a case where output is performed via a buffer circuit formed of a CMOS inverter using the FTMOST in the same manner for the purpose of increasing a load driving capability, reducing external noise, or the like. Furthermore, control signals to be applied to the control signal input nodes CN1, CNB1, CN2, CNB2, . . . , CNn, and CNBn are also supplied via the buffer circuit formed of an inverter or the like in the similar manner. The buffer circuit in the integrated circuit is physically arranged in the immediate vicinity of the multiplexer. Accordingly, the second gates of the FTMOSTs in the buffer circuits are commonly connected for each of the polarities of the FTMOSTs, and also are commonly connected to the second gates of the FTMOSTs of the same polarity constituting the multiplexer. FIG. 22 omits the illustration of these buffer circuits and accordingly referred to as a partial circuit. Similarly, MUX2 and MUX4 in FIGS. 16 to 18 and FIGS. 20 to 22 are also partial circuits.

Incidentally, a group of $2^{(n-1)}$ selectors (S11, S12, . . . , $S12^{(n-1)}$) connected to the input nodes IN1, IN2, . . . , $IN2^n$ will be referred to as a first stage selector group, a group of $2^{(n-2)}$ selectors (S21, . . . , $S22^{(n-2)}$) connected to the output nodes of the first stage selector group will be referred to as a second stage selector group, and a selector on the final stage connected to the output node QM of the multiplexer will be referred to as a $2^{(n-1)}$ stage selector group for convenience of description though the selector on the final stage is a selector Sn1 alone. Also, the number of selector groups from the first stage selector group to the final stage selector group will be referred to as the number of stages of selector groups.

The control signals applied to the control signal input nodes of the first stage selector group, that is, the control signal input nodes A and the control signal input nodes B of the selectors S11, S12, . . . , $S12^{(n-1)}$ are the control signal CN1 and its inverted control signal CNB1, respectively. Thus, either the odd numbered input nodes or the even numbered input nodes are selected and connected to the input nodes of the selector group on the next stage.

Similarly, the control signal CN2 and its inverted control signal CNB2 are applied to the second stage selector group, and either the outputs of the odd numbered selectors or the outputs of the even numbered selectors of the first stage selector group are selected. The selection is sequentially performed by the control signals in the same manner, and CNn and its inverted control signal CNBn are applied on the final stage, and an output of the first or second selector of the two outputs of the selector group including two selectors on the previous stage is selected and output to the output QM of the multiplexer.

A total of n pairs up to (CNn, CNBn) including (CN1, CNB1), (CN2, CNB2) and others are needed as control signal pairs for the selector group of each stage. Although the individual control signal pairs are mutually independent, one control signal of each control signal pair is an inversion of the other control signal, and the signals in the control signal pair are not mutually independent. Therefore, the number of independent control signals is n. In the operation of the multiplexer, only one of $2^n$ inputs, for example, the IN1 alone is selected on the basis of the values of these control signals, and the signal path cascaded with the on-state pass transistors is selected from the IN1 to the output node QM, so that a logic signal logically equivalent to the input signal of the selected input node IN1 is output to the output node QM. In the multiplexer, the threshold voltage of each of the pass transistors is commonly controlled by the entire multiplexer, and this is effective in electrically equalizing the signal paths viewed from the individual input nodes and in simplification of the circuit connection. Therefore, the threshold voltage control nodes GN2C of the selectors are commonly connected and are further connected to the threshold voltage control node GN2CN of the multiplexer.

FIG. 23 similarly shows an example of the configuration in which the number of independent control signals is increased and the number of stages of selector groups is reduced. Note that it is also possible to provide a configuration similar to that of FIG. 21 and having only one stage of selector group. A total of $2^{(n-1)}$ pairs up to ($CND2^{n-1}$, $CNE2^{n-1}$) including (CND1, CNE1), (CND2, CNE2) and others are needed as control signal pairs, and independent logical values are given to all of CND1 to $CND2^{n-1}$ and CNE1 to $CNE2^{n-1}$. Namely, for example, in the case of selecting the input node IN1, CND1 is set to a logical value of 1 to select the IN1, CNE1 is set to a logical value of 0 (IN2 is not selected), and all other control signals are set to a logical value of 0 so as not to select the IN3 and the following nodes.

Note that a multiplexer obtained by mixing FIG. 20 and FIG. 21 is also possible. For example, in the case of providing an 8-input multiplexer, two sets of the configuration of FIG. 21 are prepared and an 8-input 2-output multiplexer is configured by using the corresponding control signal input nodes as common nodes. Then, two outputs of the multiplexer thus configured are set as inputs of a 2-input multiplexer.

FIG. 24 shows a circuit symbol of a partial circuit of the $2^n$-input multiplexer (MUX$2^n$) shown in FIGS. 22 and 23 described above. Note that the control signal pair is represented by (CND1, CNE1), (CND2, CNE2), . . . , (CNDm, CNEm), and the number of the pairs vary depending on the circuit configuration as described above. Therefore, the number is represented by a natural number m. In this case, although the control signal pairs are mutually independent, there may be a case where the two control signals in the control signal pair are independent from each other or are not independent and one signal is an inverted signal of the other signal.

FIG. 25 shows a partial circuit of a $2^n$-input multiplexer using a P-type pass transistor obtained by replacing the selectors in FIGS. 22 and 23 with the selector represented by the circuit symbol of FIG. 19(b). Here, the threshold voltage control node of the multiplexer is defined as GP2CN.

As shown in FIG. 26, a partial circuit of the $2^n$-input multiplexer using the transmission gate can also be similarly configured by using the circuit symbol of FIG. 19(c). Namely, the selectors in FIGS. 22 and 23 are replaced with the selector represented by the circuit symbol of FIG. 19(c). However, the GN2CN for N-type pass transistor and the GP2CN for P-type pass transistor are needed as the threshold voltage control node.

First Embodiment

Figure 1:
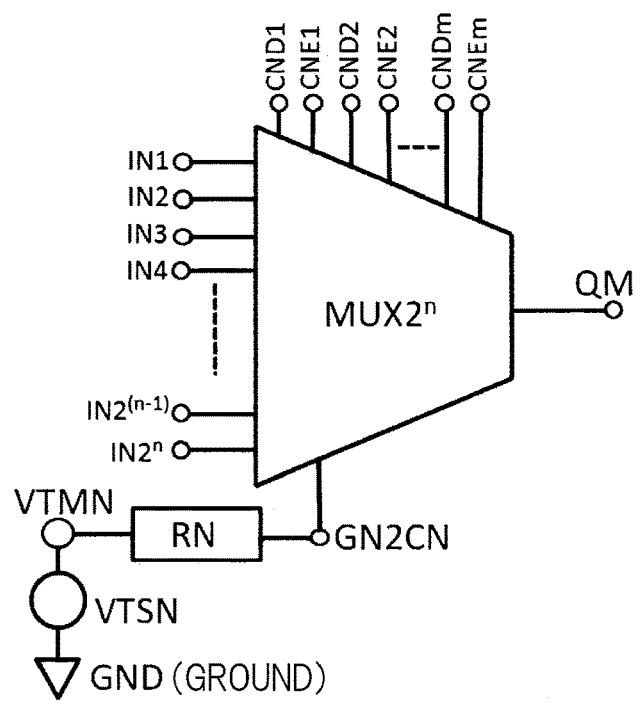
FIG. 1 is a diagram showing a multiplexer using an N-type pass transistor according to a first embodiment. One end of a resistor RN is connected to a threshold voltage control node, and the other end of the RN is connected to a power supply connection node to which a threshold voltage control power supply is connected.

FIG. 1 shows a first embodiment of the present invention. The N-type pass transistor of FIG. 24 is used, and the threshold voltage control node GN2CN of the multiplexer is connected via the resistor RN to a power supply connection node VTMN to which a threshold voltage control voltage source VTSN for the N-type pass transistor is connected. In a case where N-type SOTBMOSTs are used as the pass transistor, the second gates thereof can be constituted by one common region (common second gate region) as a transistor structure. In this case, electrical resistance of the region is set to be sufficiently small so as to enhance the functionality as the second gate. An electrical connection point for external connection of the common second gate region can also be regarded as the above-described GN2CN. Note that the potential of the second gate of each of the N-type pass transistors constituting the multiplexer can be regarded as equal to the potential of the GN2CN. Hereinafter, an operation principle will be described.

Figure 2:
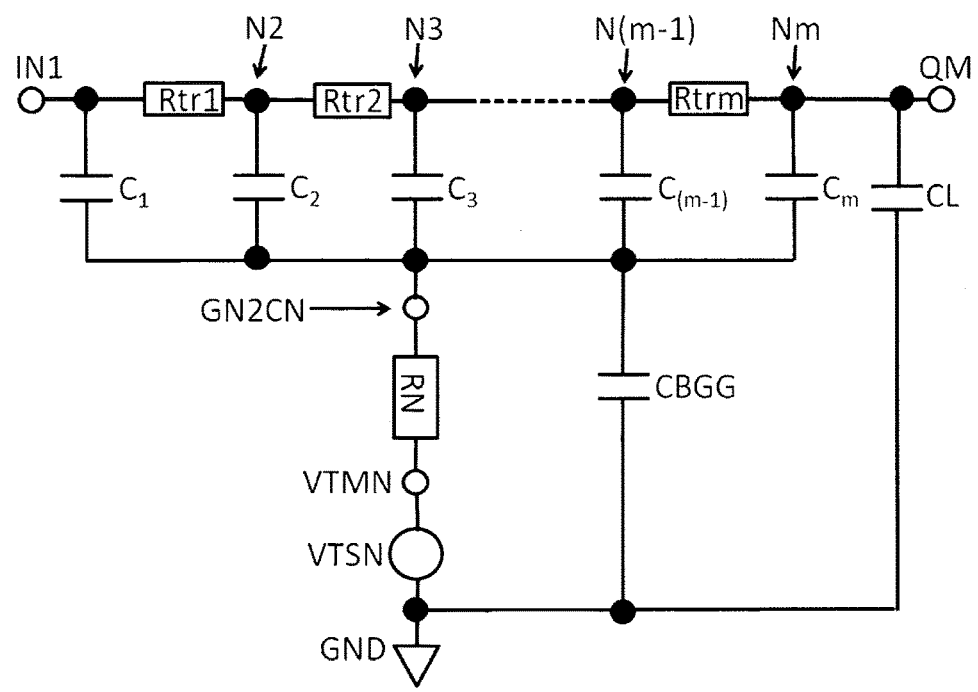
FIG. 2 is an equivalent circuit diagram showing the first embodiment in a simplified manner.

FIG. 2 shows a simplified equivalent circuit viewed from the logic signal input node IN1 in a case where the IN1 is selected. A load capacitance CL is equivalently connected between the output node QM and the ground (GND). Each of Rtr1, Rtr2, . . . , Rtrm represents equivalent resistance of each of all the on-state pass transistors forming the signal path between the IN1 and the output node QM. C1 is equal to a capacitance CDBG1 between the drain of the pass transistor of the first stage and the GN2CN. C2 is equal to a sum of a capacitance CSBG1 between the source of the pass transistor of the first stage and the GN2CN and a capacitance CDBG2 between the drain of the pass transistor of the next stage and the GN2CN. C3 is equal to a sum of a capacitance CSBG2 between the source of the pass transistor of the next stage and the GN2CN and a capacitance CDBG3 between the drain of the pass transistor of the third stage and the GN2CN. The same applies up to $C_{(m-1)}$, and $C_m$ is equal to a capacitance CSBGm between the source of the pass transistor of the final stage and the GN2CN.

Furthermore, a total parasitic capacitance Cstr, that is, the sum of the parasitic capacitance between the GN2CN and the ground and the capacitance between the GN2CN and the drain or source of the pass transistor connected directly or via on-state pass transistor to the unselected input in an AC-grounded state, is connected between the GN2CN and the ground.

Although not shown, a buffer composed of a CMOS inverter or the like constituted of FTMOST is connected to the output node QM. This buffer is usually physically located in the immediate vicinity of the multiplexer, and the second gate of the N-type FTMOST among the transistors constituting the CMOS inverter is connected to the common second gate GN2CN of the multiplexer. Therefore, the output of the inverter can be regarded as being in an AC-grounded state, and a parasitic capacitance between the source/drain and the second gate of the N-type FTMOST of the inverter is further added to the above-described Cstr. Moreover, the control signal applied to the control signal node is applied to each of the control nodes via a CMOS inverter physically arranged in the immediate vicinity of the multiplexer in order to avoid deterioration of the signal due to the long wiring. Each of the CMOS inverters is similar to the buffer CMOS inverter, and a parasitic capacitance between the source/drain and the second gate of the N-type FTMOST constituting the inverter is further added to the above-described Cstr. The sum Cstr is shown in FIG. 2 as CBGG. In this equivalent circuit, though it is not simple, a differentiating circuit is formed from a total capacitance CPG2 of C1 to Cm between the IN1 and the GN2CN and the resistor RN between the GN2CN and the power supply connection node VTMN.

Figure 3:
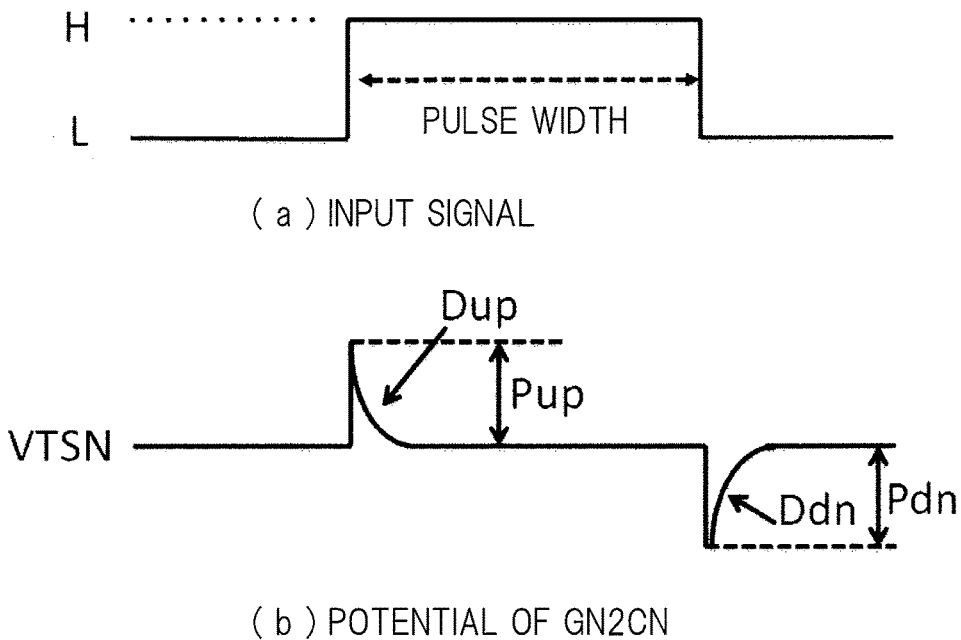
FIG. 3 is an explanatory diagram for an operation principle of the first embodiment.

As shown in FIG. 3(a), a logic signal whose logic signal level (potential value) temporally changes stepwise from a low level (low level: L) to a high level (high level: H) is input to the IN1. At this time, the potential of the common second gate node, that is, the GN2CN changes instantaneously as shown in FIG. 3(b). Then, a temporal decay characteristic becomes potential changes Dup and Ddn having a shape of differential waveform substantially determined by a time constant TNB=RN*CBGG. However, the TNB is smaller than the pulse width of the input waveform at the high level in this case. Accordingly, when the input waveform next changes to the low level, the potential of GN2CN is substantially equal to VTSN.

Each of Pup and Pdn indicates an absolute value of a difference between a peak value of the potential of the GN2CN and the VTSN. This value is ideally equal to the potential difference between the high level and the low level. In practice, however, since the potential difference between the high level and the low level is proportionally distributed by a ratio of the reciprocal of CPG2 and the reciprocal of CBGG when the parasitic capacitance CBGG is present, the Pup and Pdn become smaller as the CBGG becomes larger.

Here, the decay time of the potential change in the shape of differential waveform of the GN2CN shown in FIG. 3(b) can be more delayed than the propagation delay time when the value of RN is sufficiently increased. At this time, the potential can be regarded to be substantially constant within the propagation delay time. Specifically, when the logic signal level of the selected logic signal input node IN1 changes from L to H (at a rising edge), the potential of GN2CN remains at a value substantially close to VTSN+Pup. This means that an initial value QQ0 is (CPG2+CL)*(L−VTSN) in a charge amount change DQR needed to be charged to $C_1, C_2, C_3, \ldots, C_m$ within the propagation delay time. Also, a value QQ1 after the signal level change is represented by CPG2*(H−VTSN−Pup)+CL(H−VTSN), and DQR=QQ1−QQ0=CPG2*(H−L−Pup)+CL*(H−L) is established.

In a case where Pup is zero, that is, in a case where there is no RN, the charge amount change of CPG2 is CPG2*(H−L), and thus, the charge amount change may be decreased by CPG2*Pup. Namely, CPG2 becomes smaller, with the result that the load capacitance of the signal path can be reduced. Accordingly, the propagation delay time can be reduced. The Pup is also desirably large. Note that the potential of pass transistor connection points N2, N3, . . . , Nm on the signal path rises in pulse shape due to the rise of GN2CN in pulse shape, but the rise is smaller than Pup because of the presence of the load capacitance CL. However, it changes in the direction of decreasing the propagation delay time. When the Pup is large, the threshold voltage of the pass transistor by the second gate is transiently reduced, and the propagation delay time can be further reduced.

Conversely, when the logic signal level of the selected logic signal input node IN1 changes from H to L (at a falling edge), the potential can be similarly regarded as remaining at a value substantially equal to VTSN−Pdn. This means that an initial value QQ2 is (CPG2+CL)*(H−VTSN) in the charge amount change DQF to be discharged from the CPG2 within the propagation delay time, and a value QQ3 after the level change becomes CPG2*(L−(VTSN−Pdn))+CL*H. Therefore, DQF=QQ2−QQ3=CPG2*(H−L−Pdn)+CL*(H−L) is established, so that the CPG2 is reduced and the load capacitance of the signal path can be reduced as well. Accordingly, the propagation delay time can be reduced also in this case. The Pdn is also desirably large.

Note that the potential of pass transistor connection points N2, N3, . . . , Nm on the signal path falls in pulse shape due to the fall of GN2CN in pulse shape, but the fall is smaller than Pdn because of the presence of the load capacitance CL. This case also corresponds to a change in the direction of decreasing the propagation delay time. When the Pdn is large, the threshold voltage of the pass transistor by the second gate is transiently increased, and this increases the propagation delay time. However, if the effect of reducing the load capacitance is large due to the large Pdn, the propagation delay time can be reduced after all. The above-described load capacitance reduction effect does not depend on the VTSN, that is, the steady state potential of the common second gate node GN2CN.

Figure 4:
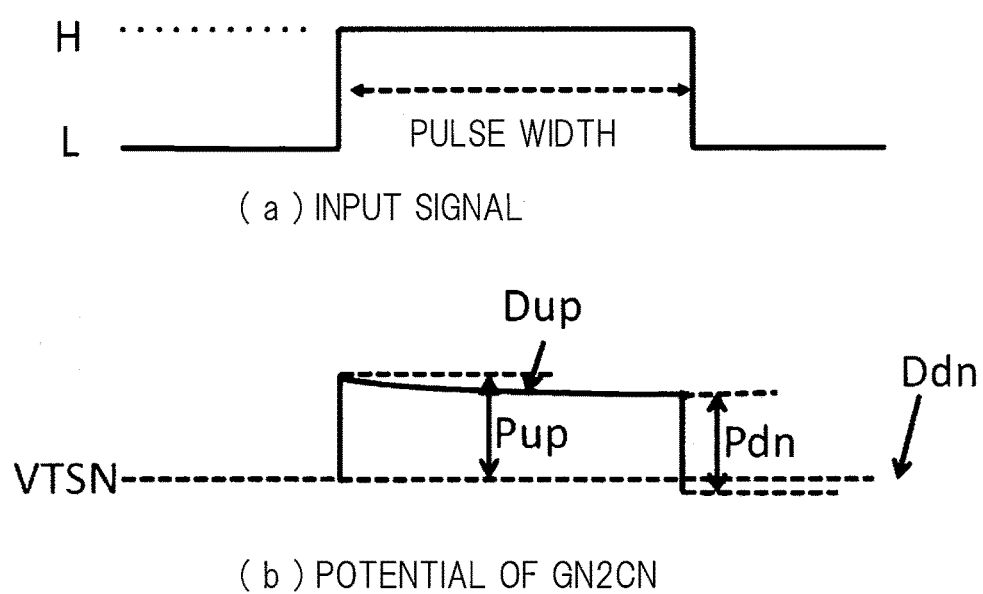
FIG. 4 is an explanatory diagram for an operation principle of the first embodiment in a case where an RN value is large.

As shown in FIG. 4, when the decay time constant TNB determined by the product of CBGG and RN is increased to about the pulse width of the input signal at the high level by increasing the RN, it is possible to prevent the potential of the GN2CN from being greatly lower than VTSN+Pup while the input signal is at the high level. At this time, since Pdn should be substantially equal to Pup at the falling edge of the input signal, the potential of GN2CN at the falling edge would not greatly fall below VSTN. Namely, it is possible to suppress an increase in the threshold voltage. Since the load capacitance reduction effect does not depend on the potential of GN2CN immediately before the change of input signal, the propagation delay time can be reduced compared with the case where the RN is small.

Note that FIG. 4 corresponds to the case where an input signal that can be regarded as one-time signal is applied or the case where the pulse width of the high level is sufficiently shorter than a low level period. When an input signal whose high level period and low level period are substantially equal to each other is repeatedly applied, the potential of GN2CN changes to high or low around VTSN. Even in this case, the propagation delay time can be reduced because the above-described load capacitance reduction effect does not depend on the potential of GN2CN immediately before the change of input signal. Furthermore, the effect of approximately Pup/2 can be expected as the threshold voltage reduction effect by the change at the rising edge of the input signal and the threshold voltage increase effect by the change at the falling edge is approximately Pdn/2, and it is thus possible to suppress an increase in the propagation delay time.

Meanwhile, a constant potential of high level or low level is applied to the input node of the multiplexer in the steady state. Although it is preferable that all the input nodes are at high level or low level, this is not a typical case. Therefore, the input nodes may be connected to each other by a current path (referred to as a leakage path) from a high level to a low level composed of a plurality of pass transistors (one transistor in the case of MUX2) including at least one off-state pass transistor. Also, a plurality of leakage paths may be provided between predetermined input nodes. At this time, a leakage current flowing through the leakage path increases depending on the assignment of the high level or the low level given to each of the logic signal input nodes. Accordingly, the reduction in the leakage current is important in the multiplexer, and the leakage current can be reduced by setting the value of the potential VTSN of the common second gate in the steady state such that the threshold voltage of the pass transistor is increased.

On the other hand, the on-resistance Ron of the pass transistor in an operating state increases, and the transfer rate is decreased. Even in this case, the decrease in the transfer rate can be reduced by using the configuration shown in FIG. 1, and it is possible to achieve both the reduction in the leakage current and the increase in the transfer rate. Since the second gate of each of the pass transistors constituting the multiplexer is commonly connected to the GN2CN, the above-described effect works equally on the pass transistors on the signal path, and thus does not depend on the selected input.

Second Embodiment

Figure 5:
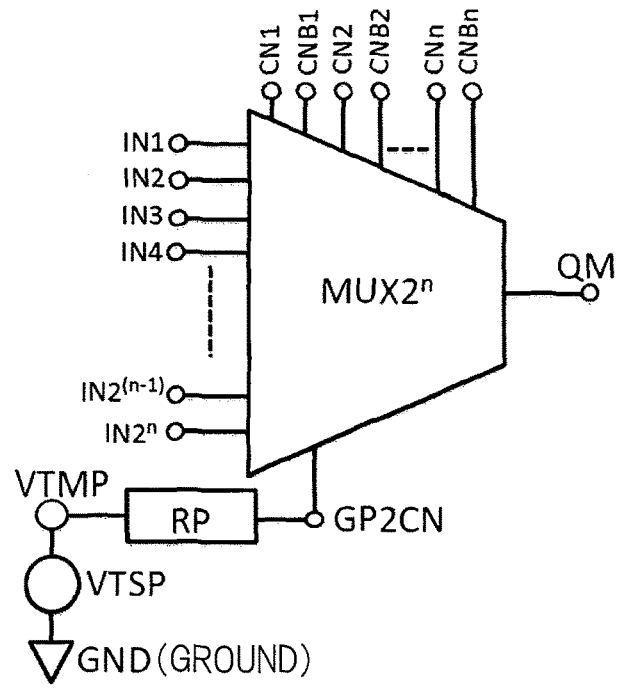
FIG. 5 is a diagram showing a multiplexer using a P-type pass transistor according to a second embodiment. One end of a resistor RP is connected to a threshold voltage control node, and the other end of the RP is connected to a power supply node to which a threshold voltage control power supply is connected.

FIG. 5 shows a second embodiment of the present invention. The threshold voltage control node GP2CN of the multiplexer using the P-type pass transistor of FIG. 25 is connected via the resistor RP to a power supply connection node VTMP to which a threshold voltage control voltage source VTSP is connected. In a case where SOTBMOSTs are used as the pass transistor, the second gates thereof can be constituted by one common region (common second gate region). At this time, electrical resistance of the region is set to be sufficiently small so as to enhance the functionality as the second gate. In a case where the electrical connection point for external connection of this common second gate region is also set to the GP2CN, the GP2CN and the power supply connection node VTMP are also connected via the resistor RP. The potential of the GP2CN can be regarded as equal to the potential of the second gate of each of the pass transistors constituting the multiplexer. The operation principle is similar to the case of the first embodiment when a difference in polarity between the N-type pass transistor of the first embodiment and the P-type pass transistor of the present embodiment is taken into consideration for the signal path formed by the P-type pass transistor.

Third Embodiment

FIG. 6 shows a third embodiment of the present invention. The first threshold voltage control node GN2CN for the N-type pass transistor of the multiplexer in FIG. 26 using the transmission gate is connected via the resistor RN to the power supply connection node VTMN to which the threshold voltage control voltage source VTSN for the N-type pass transistor is connected. Moreover, the second threshold voltage control node GP2CN for the P-type pass transistor is connected via the resistor RP to the power supply connection node VTMP to which the threshold voltage control voltage source VTSP for the P-type pass transistor is connected. The operation principle is similar to the case of the first and second embodiments for the signal path formed by the N-type pass transistors and the signal path formed by the P-type pass transistors in the transmission gate.

The resistors RN and RP used in the first to third embodiments are linear resistors in which a resistance value hardly changes with the potentials at both ends. Accordingly, as shown in FIG. 2, the peak values Pup and Pdn of the potential change in the shape of differential waveform occurring at the common second gate node are substantially the same value. The effect of the presence of these values will be described based on the case of the N-type pass transistor.

In a transient state of about propagation delay time of the logic signal from the logic signal input node to the output node QM of the multiplexer, the threshold voltage becomes smaller as the Pup becomes larger, and the Ron is thus transiently decreased and the transfer rate is further increased with synergistic effect of the apparent decrease of the CPG2. On the other hand, the threshold voltage becomes larger as the Pdn becomes larger, and the Ron transiently becomes larger than a value to be set at VTSN when the decay time constant TBN is sufficiently smaller than the pulse width at the high level, so that an increase in the transfer rate due to the apparent decrease of the CPG2 can be suppressed. Therefore, it is effective to suppress the Pdn in order to increase the transfer rate at the falling edge of the logic signal.

The same applies to the case of using a P-type pass transistor. However, the roles of Pup and Pdn are reversed. Namely, it is effective to be able to suppress the Pup in order to increase the transfer rate at the rising edge of the logic signal.

Furthermore, in a case where a transmission gate is used, it is effective to suppress the Pdn in order to increase the transfer rate at the falling edge of the logic signal for the N-type pass transistor, and it is effective to be able to suppress the Pup in order to increase the transfer rate at the rising edge of the logic signal for the P-type pass transistor.

Fourth Embodiment

FIG. 7 shows a fourth embodiment for obtaining the above-described effects by a $2^n$-input multiplexer MUX$2^n$ in the case of using N-type pass transistors. A potential VGN2CN of the threshold voltage control node GN2CN common to each of the pass transistors is VTSN in the steady state because the pulse width at the high level is sufficiently smaller than the decay time constant TBN. Thus, the linear resistor RN connected between the GN2CN and the power supply connection node VTMN is replaced with the nonlinear resistor RVN. The nonlinear resistor RVN ideally has the characteristics of being in a high resistance state when the potential VGN2CN is higher than VTSN and being in a low resistance state when the potential VGN2CN is lower than VTSN by a set value (DNdn) or more, not only in the steady situation but also in a transient situation.

As shown in FIG. 8(a), in the case of the N-type pass transistor, the equivalent circuit from the selected logic signal input node (IN1) to the threshold voltage control power supply VTSN is illustrated in a simplified manner on an assumption that the resistance of the pass transistor in the conduction state is sufficiently small. However, as described above, the decay time constant TBN is assumed to be sufficiently smaller than the pulse width at the high level. In FIG. 8(a), CPG2 is a capacitance between the selected signal path to which IN1 is connected and the common second gate. Moreover, CBGG is a parasitic capacitance between the common second gate and the ground (GND).

When the logic signal level of IN1 changes from a low level (L) to a high level (H) as shown in FIG. 8(b), potential change DNup in the shape of differential waveform in a positive direction is generated at the GN2CN as shown in FIG. 8(c), and the RVN is brought in the high resistance state. Accordingly, since an absolute value (PNup) of the difference between the peak value and the potential VTSN of the GN2CN in the steady state is large so as to work to enhance the current flowing in each of the N-type pass transistors on a selected path and the CPG2 is apparently decreased, the effect of increasing the transfer rate is obtained. Conversely, when the selected logic signal input node IN1 changes from the high level (H) to the low level (L), DNdn in the shape of differential waveform in a negative direction is generated at the GN2CN, but when the potential falls below the VTSN by the set value PNdn or more, that is, falls to VTSN-PNdn or less, the RVN is brought in the low resistance state and the peak value is limited to PNdn. The PNdn is set to smaller than PNup. In this manner, it is possible to suppress an excessive reduction in the transfer rate due to the increase in the threshold voltage at the falling edge.

Fifth Embodiment

FIG. 9 shows a fifth embodiment for obtaining the above-described effects by a $2^n$-input multiplexer MUX$2^n$ in the case of using P-type pass transistors. A potential VGP2CN of the threshold voltage control node GP2CN common to each of the pass transistors is VTSP in the steady state because the pulse width at the high level is sufficiently smaller than the decay time constant TBN. Thus, the linear resistor RP connected between the GP2CN and the power supply connection node VTMP is replaced with the nonlinear resistor RVP. The nonlinear resistor RVP ideally has the characteristics of being in a high resistance state when the potential VGP2CN is lower than VTSP and being in a low resistance state when the potential VGP2CN is higher than VTSP by a set value (DPup) or more, that is, when the potential VGP2CN becomes VTSP+PPup or more, not only in the steady situation but also in a transient situation.

As shown in FIG. 10(a), in the case of the P-type pass transistor, the equivalent circuit from the selected logic signal input node (IN1) to the threshold voltage control power supply VTSP is illustrated in a simplified manner on an assumption that the resistance of the pass transistor in the conduction state is sufficiently small. In FIG. 10(a), CPG2 is a capacitance between the selected signal path to which IN1 is connected and the common second gate. Moreover, CBGG is a parasitic capacitance between the common second gate and the ground (GND).

When the logic signal level of IN1 changes from a low level (L) to a high level (H) as shown in FIG. 10(b), potential change DPup in the shape of differential waveform in a positive direction is generated at the GP2CN as schematically shown in FIG. 10(c), and the RVP is brought in the low resistance state when the potential is increased to VTSP+PPup or more, so that the peak value is limited to PPup. Conversely, when the selected logic signal input node IN1 changes from the high level (H) to the low level (L), DPdn in the shape of differential waveform in a negative direction is generated at the GP2CN, and RVP is brought in the high resistance state. Accordingly, since an absolute value (PPdn) of the peak value is large so as to work to enhance the current flowing in each of the P-type pass transistors on a selected path and the CPG2 is apparently decreased, the effect of increasing the transfer rate is obtained. The PPup is set to smaller than PPdn. In this manner, it is possible to suppress an excessive reduction in the transfer rate due to the increase in the absolute value of the threshold voltage at the rising edge.

FIG. 11 shows a sixth embodiment for obtaining the above-described effects by the $2^n$-input multiplexer MUX$2^n$ in a case of using a transmission gate (abbreviated as TG). The first threshold voltage control node GN2CN for the N-type pass transistor is connected via a nonlinear resistor RVN1 having a characteristic similar to that of the RVN of the fourth embodiment to the power supply node VTMN to which the voltage source VTSN is connected. Further, the second threshold voltage control node GP2CN for the P-type pass transistor is connected via a nonlinear resistor RVP1 having a characteristic similar to that the RVP of the fifth embodiment to the power supply node VTMP to which the voltage source VTSP is connected. At the rising edge of the logic signal applied to the selected input node, for example, IN1, the transfer rate of the N-type pass transistor of TG is increased, and an excessive reduction of the transfer rate of the P-type pass transistor of TG is suppressed. Also, at the falling edge, an excessive reduction in the transfer rate of the N-type pass transistor of TG is suppressed. At the same time, the transfer rate of the P-type pass transistor of the TG is increased, so that it is possible to increase the transfer rate by the TG in the transient state of the input logic signal.

It is preferable that the resistance values of the nonlinear resistors RVN, RVN1, RVP, and RVP1 change rapidly in terms of time, and a circuit element capable of high-speed operation such as a MOS transistor is desirably used.

FIG. 12 shows a specific configuration example of the nonlinear resistor RVN or RVN1 using the N-type FTMOST. As shown in FIG. 12(a), a first gate G1RVN and a drain D of MNRV which is an N-type FTMOST are connected and are further connected to the power supply connection node VTMN to which the threshold voltage control power supply VTSN of the N-type pass transistor of the multiplexer is connected. A source S is connected to the threshold voltage control node GN2CN of the N-type pass transistor of the multiplexer. A second gate G2RVN is connected to a power supply connection node VTMNRV to which a threshold voltage control voltage source VTRVN of the MNRV is connected.

FIG. 12(b) shows a relationship of a current IS flowing between the node GN2CN and VTMN and the potential VGN2CN of the node GN2CN when the potential of the node VTMN is set to VTSN. Specifically, when the threshold voltage of the MNRV is defined as VTHRVN, a large current begins to flow when the value of VGN2CN is smaller than VTSN-VTHRVN, and the resistance between the nodes GN2CN and VTMN is decreased. Conversely, the current becomes extremely small when the value of VGN2CN becomes larger than VTSN-VTHRVN, and the resistance between the nodes GN2CN and VTMN is increased. From the fact that the value of VGN2CN indicating the boundary between the high resistance value and the low resistance value is shifted from VTSN by VTHRVN, it can be said that the value of PNdn in FIG. 8 is substantially determined by the value of VTHRVN, and the characteristic of RVN of FIG. 8 can be substantially achieved. VTHRVN can be controlled by a voltage value of the power supply VTRVN connected to VTMNRV, so that the characteristic needed for RVN or RVN1 in FIG. 11 can be achieved.

FIG. 13 shows a specific configuration example of the nonlinear resistor RVP or RVP1.

As shown in FIG. 13(a), a first gate G1RVP and a source S of MPRV which is a P-type FTMOST are connected, and are further connected to the threshold voltage control node VTMP to which the threshold voltage control power supply VTSP of the P-type pass transistor of the multiplexer is connected. A drain D is connected to the threshold voltage control node GP2CN of the P-type pass transistor of the multiplexer. A second gate G2RVP is connected to a power supply connection node VTMPRV to which a threshold voltage control voltage source VTRVP of MPRV is connected.

FIG. 13(b) schematically shows a relationship of a current ID flowing between the node GP2CN and VTMP and the potential VGP2CN of the node GP2CN when the potential of the node VTMP is set to VTSP. Specifically, when the absolute value of the threshold voltage of the MPRV is defined as VTHRVP, a large current begins to flow when the value of VGP2CN is larger than VTSP+VTHRVP, and the resistance between the nodes GP2CN and VTMP is decreased. Conversely, the current becomes extremely small when the value of VGP2CN becomes smaller than VTSP+VTHRVP, and the resistance between the nodes GP2CN and VTMP is increased. From the fact that the value of VGP2CN indicating the boundary between the high resistance value and the low resistance value is shifted by VTHRVP, the value of PPup in FIG. 10 is determined by the value of VTHRVP, and the characteristic of RVP of FIG. 9 can be substantially achieved. VTHRVP can be controlled by a voltage value of the power supply VTRVP connected to VTMPRV, so that the characteristic needed for RVP or RVP1 in FIG. 11 can be achieved.

In the foregoing, the embodiments according to the present invention and modifications based on the embodiments have been described. However, the present invention is not necessarily limited to these, and those skilled in the art will find various alternative embodiments and alternations without departing from the spirit of the present invention or the scope of the appended claims.

What is claimed is:

1. A multiplexer comprising a plurality of pass transistors each formed by a four-terminal double insulated gate field effect transistor,
   wherein one of gates of the field effect transistor is connected to a threshold voltage control node, and
   a resistor is connected between the threshold voltage control node and a threshold voltage control voltage source;
   wherein the field effect transistor is of N-type, and
   the resistor is a nonlinear resistor having two high and low resistance values and is configured to take the high resistance value when a potential of the threshold voltage control node is above a reference potential based on a potential of the threshold voltage control power supply.

2. The multiplexer according to claim 1, wherein
   the field effect transistor is of P-type, and
   the resistor is a nonlinear resistor having two high and low resistance values and is configured to take the low resistance value when a potential of the threshold voltage control node is above a reference potential based on a potential of the threshold voltage control power supply.

3. The multiplexer according to claim 1, wherein
   the nonlinear resistor is a four-terminal double insulated gate N-type field effect transistor,
   one of gates is connected to a power supply connection node to which the threshold voltage control voltage source is connected, and
   a source and a drain or a drain and a source are connected to the power supply connection node and the threshold voltage control node, respectively.

4. The multiplexer according to claim 2, wherein
   the nonlinear resistor is a four-terminal double insulated gate P-type field effect transistor,
   one of gates is connected to a power supply connection node to which the threshold voltage control voltage source is connected, and
   a source and a drain or a drain and a source are connected to the power supply connection node and the threshold voltage control node, respectively.

5. An integrated circuit comprising a multiplexer including a plurality of pass transistors each formed by a four-terminal double insulated gate field effect transistor,
   wherein the multiplexer is configured such that one of gates of the field effect transistor is connected to a threshold voltage control node and a resistor is connected between the threshold voltage control node and a threshold voltage control voltage source.

6. The integrated circuit according to claim 5, wherein
   the field effect transistor is of N-type, and
   the resistor is a nonlinear resistor having two high and low resistance values and is configured to take the high resistance value when a potential of the threshold voltage control node is above a reference potential based on a potential of the threshold voltage control power supply.

7. The integrated circuit according to claim 5, wherein the field effect transistor is of P-type, and
the resistor is a nonlinear resistor having two high and low resistance values and is configured to take the low resistance value when a potential of the threshold voltage control node is above a reference potential based on a potential of the threshold voltage control power supply.

8. The integrated circuit according to claim 6, wherein
the nonlinear resistor is a four-terminal double insulated gate N-type field effect transistor,
one of gates is connected to a power supply connection node to which the threshold voltage control voltage source is connected, and
a source and a drain or a drain and a source are connected to the power supply connection node and the threshold voltage control node, respectively.

9. The integrated circuit according to claim 7, wherein
the nonlinear resistor is a four-terminal double insulated gate P-type field effect transistor,
one of gates is connected to a power supply connection node to which the threshold voltage control voltage source is connected, and
a source and a drain or a drain and a source are connected to the power supply connection node and the threshold voltage control node, respectively.

10. A multiplexer comprising a plurality of transmission gates each formed by four-terminal double insulated gate N-type and P-type field effect transistors connected in parallel, wherein
one of gates of the N-type gate field effect transistor is connected to a first threshold voltage control node,
a first resistor is connected between the first threshold voltage control node and a first threshold voltage control voltage source,
one of gates of the P-type gate field effect transistor is connected to a second threshold voltage control node, and
a second resistor is connected between the second threshold voltage control node and a second threshold voltage control voltage source.

11. The multiplexer according to claim 10, wherein
each of the first and second resistors is a nonlinear resistor having two high and low resistance values,
the first resistor is configured to take the high resistance value when a potential of the first threshold voltage control node is above a reference potential based on a potential of the first threshold voltage control voltage source, and
the second resistor is configured to be from the high resistance value to the low resistance value when a potential of the second threshold voltage control node exceeds a reference potential based on a potential of the second threshold voltage control voltage source.

12. The multiplexer according to claim 10, wherein
the first resistor and the second resistor are four-terminal double insulated gate N-type and P-type field effect transistors, respectively,
the first resistor is configured such that one of gates is connected to a power supply connection node to which the first threshold voltage control voltage source is connected and a source and a drain or a drain and a source are connected to the power supply connection node and the first threshold voltage control node, respectively, and
the second resistor is configured such that one of gates is connected to a power supply connection node to which the second threshold voltage control voltage source is connected, and configured to be connected to the power supply connection node and the second threshold voltage control node.

13. An integrated circuit comprising a multiplexer including a plurality of transmission gates each formed by four-terminal double insulated gate N-type and P-type field effect transistors connected in parallel,
wherein the multiplexer is configured such that one of gates of the N-type gate field effect transistor is connected to a first threshold voltage control node, a first resistor is connected between the first threshold voltage control node and a first threshold voltage control voltage source, one of gates of the P-type gate field effect transistor is connected to a second threshold voltage control node, and a second resistor is connected between the second threshold voltage control node and a second threshold voltage control voltage source.

14. The integrated circuit according to claim 13, wherein
each of the first and second resistors is a nonlinear resistor having two high and low resistance values,
the first resistor is configured to take the high resistance value when a potential of the first threshold voltage control node is above a reference potential based on a potential of the first threshold voltage control voltage source, and
the second resistor is configured to be from the high resistance value to the low resistance value when a potential of the second threshold voltage control node exceeds a reference potential based on a potential of the second threshold voltage control voltage source.

15. The integrated circuit according to claim 13, wherein
the first resistor and the second resistor are four-terminal double insulated gate N-type and P-type field effect transistors, respectively,
the first resistor is configured such that one of gates is connected to a power supply connection node to which the first threshold voltage control voltage source is connected and a source and a drain or a drain and a source are connected to the power supply connection node and the first threshold voltage control node, respectively, and
the second resistor is configured such that one of gates is connected to a power supply connection node to which the second threshold voltage control voltage source is connected, and configured to be connected to the power supply connection node and the second threshold voltage control node.

16. A multiplexer comprising a plurality of pass transistors each formed by a four-terminal double insulated gate field effect transistor, wherein
one of gates of the field effect transistor is connected to a threshold voltage control node, and
a resistor is connected between the threshold voltage control node and a threshold voltage control voltage source;
wherein the field effect transistor is of P-type, and
the resistor is a nonlinear resistor having two high and low resistance values and is configured to take the low resistance value when a potential of the threshold voltage control node is above a reference potential based on a potential of the threshold voltage control power supply.

17. The multiplexer according to claim 16, wherein the nonlinear resistor is a four-terminal double insulated gate P-type field effect transistor, one of gates is connected to a power supply connection node to which the threshold voltage control voltage source is connected, and a source and a drain or a drain and a source are connected to the power supply connection node and the threshold voltage control node, respectively.

* * * * *